United States Patent
Misaki

(10) Patent No.: US 9,274,633 B2
(45) Date of Patent: Mar. 1, 2016

(54) LIQUID CRYSTAL DISPLAY DEVICE AND METHOD FOR MANUFACTURING SAME

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 77 days.

(21) Appl. No.: 13/518,948

(22) PCT Filed: Nov. 19, 2010

(86) PCT No.: PCT/JP2010/070706
§ 371 (c)(1),
(2), (4) Date: Jun. 25, 2012

(87) PCT Pub. No.: WO2011/086766
PCT Pub. Date: Jul. 21, 2011

(65) Prior Publication Data
US 2012/0287357 A1 Nov. 15, 2012

(30) Foreign Application Priority Data
Jan. 15, 2010 (JP) .................... 2010-007253

(51) Int. Cl.
*G06F 3/041* (2006.01)
*G02F 1/1333* (2006.01)
*H01L 23/544* (2006.01)

(52) U.S. Cl.
CPC .......... *G06F 3/0412* (2013.01); *G02F 1/13338* (2013.01); *G06F 3/041* (2013.01); G02F2001/133354 (2013.01); G06F 3/0418 (2013.01); H01L 23/544 (2013.01); H01L 2223/5442 (2013.01); H01L 2223/54426 (2013.01)

(58) Field of Classification Search
CPC ............... C23F 1/26; C23F 1/30; C23F 1/40; C23F 4/00; G02F 1/13338; G02F 2001/133354; G06F 3/0412; G06F 3/041; G06F 3/0418; H01L 23/544; H01L 2223/54426; H01L 2223/5442; H01L 2223/54473

USPC ................. 349/12; 438/975; 356/620, 237.3, 356/237.4; 345/173–178, 4, 5; 178/18.01–18.11
See application file for complete search history.

(56) References Cited

U.S. PATENT DOCUMENTS

| 4,297,004 | A | * | 10/1981 | Nishimura et al. ........... 349/138 |
| 5,366,588 | A | * | 11/1994 | Scholten et al. ............. 216/101 |
| 5,936,695 | A | | 8/1999 | Hida et al. |
| 6,307,613 | B1 | * | 10/2001 | Iida ............... 349/158 |
| 2009/0033224 | A1 | * | 2/2009 | Hahn et al. ................... 313/582 |
| 2009/0086113 | A1 | * | 4/2009 | Ko et al. ........................ 349/12 |

FOREIGN PATENT DOCUMENTS

| JP | 04-205342 A | 7/1992 |
| JP | 2000-173384 A | 6/2000 |
| JP | 2008-9054 A | 1/2008 |

OTHER PUBLICATIONS

Official Communication issued in International Patent Application No. PCT/JP2010/070706, mailed on Jan. 11, 2011.

* cited by examiner

*Primary Examiner* — Michael Caley
*Assistant Examiner* — Angela Davison
(74) *Attorney, Agent, or Firm* — Keating & Bennett, LLP

(57) ABSTRACT

The present invention provides a liquid crystal display device capable of reducing the number of steps and material costs and a method of producing the liquid crystal display device. A liquid crystal display device (100) of the present invention includes a liquid crystal display panel (105); and a touch panel (106). Out of the liquid crystal display panel (105) and the touch panel (106), one panel serves as a reference for alignment between the liquid crystal display panel (105) and the touch panel (106) and the other panel is aligned with the one panel. The other panel is provided with a second alignment mark that is aligned with a first alignment mark of the one panel. The second alignment mark is constituted by a transparent member.

11 Claims, 18 Drawing Sheets

LIQUID CRYSTAL DISPLAY DEVICE AND METHOD FOR MANUFACTURING SAME

TECHNICAL FIELD

The present invention relates to a liquid crystal display device having a touch panel function and a method for manufacturing the liquid crystal display device.

BACKGROUND ART

In recent years, there have been provided high-performance liquid crystal display devices, each of which includes a liquid crystal display panel to which a touch panel function is imparted in addition to an information displaying function so as to improve convenience for users (for example, refer to Patent Literature 1).

A specific example of such liquid crystal display devices is the one including (i) a liquid crystal display panel serving as a display section in which information including characters and images is displayed and (ii) a touch panel assembled to a display surface or to a surface opposite to the display surface of the liquid crystal display panel.

Because of its information displaying function achieved by the liquid crystal display panel and its another function of receiving input via the touch panel, such a liquid crystal display device is capable of providing users with various services such as displaying of information corresponding to input of instructions by the uses.

Specifically, the liquid crystal display device is configured such that (i) the liquid crystal display device displays an input screen on the display surface of its liquid crystal display panel and (ii) the touch panel detects an input operation carried out by a user with respect to the input screen. The liquid crystal display device is arranged such that user's desired information can be displayed by changing, according to the result of detection by the touch panel, the input screen displayed on the display surface to a screen showing information that the user instructed via the input screen.

Meanwhile, a high-value-added liquid crystal display device, which includes an in-cell capacitive touch panel (multi-touch) in a liquid crystal display panel, is highly likely to be produced, and is expected to be able to significantly reduce the number of steps and material costs as compared with a conventional liquid crystal display device having a touch panel function. The following description discusses such a liquid crystal display device.

FIG. 11 is a view schematically illustrating a configuration of the aforementioned liquid crystal display device. As illustrated in FIG. 11, this liquid crystal display device 500 includes a liquid crystal display panel 505 and a touch panel 506. The liquid crystal display panel 505 is constituted by a TFT substrate 501, a color filter substrate 502 and a glass substrate 503. The touch panel 506 is constituted by the glass substrate 503 and a protection film 504.

As illustrated in FIG. 11, the liquid crystal display device 500 is configured such that the liquid crystal display panel 505 and the touch panel 506 are arranged in this order. As described earlier, the touch panel 506 is an in-cell touch panel included in the liquid crystal display panel 505.

According to this configuration, alignment is required between an existing pattern on the color filter substrate 502, which existing pattern is positioned on the back surface-side of the glass substrate 503, and a design pattern under the protection film 504, which design pattern is positioned on the front surface-side of the glass substrate 503. This is to optimally set the relative position of the patterns. The following description discusses such alignment.

FIG. 12 is a view for describing alignment between the back surface-side and the front surface-side of the glass substrate 503. As illustrated in FIG. 12, an alignment mark 51 is provided on the color filter substrate 502. The alignment mark 51 is in the shape of a cross when viewed from above (refer to I in FIG. 12).

A design pattern on the glass substrate 503 is aligned with the alignment mark 51 which serves as a reference.

On the glass substrate 503, a design pattern optimally positioned relative to the alignment mark 51 is formed. The design pattern includes an alignment mark 52. The alignment mark 52 is also in the shape of a cross when viewed from above (refer to J in FIG. 12).

Such alignment marks 51 and 52 can be formed for example in the following manner. FIG. 13 is a view for describing the steps of forming the alignment marks 51 and 52.

First, as illustrated in (a) of FIG. 13, a metal film 52b is stacked on the glass substrate 503. The metal film 52b is stacked on the entire surface of the glass substrate 503.

Next, as illustrated in (b) of FIG. 13, a resist pattern 53 is formed on the metal film 52b. The resist pattern 53 is a pattern for removing the metal film 52b which is stacked above an alignment region where a plurality of alignment marks 51 are provided on the color filter substrate 502. Note that a design pattern of the resist pattern 53 is not aligned with the alignment mark 51 which serves as a reference.

Next, as illustrated in (c) of FIG. 13, the metal film 52b is removed according to the resist pattern 53. That is, the metal film 52b above the alignment region of the color filter substrate 502 is removed. After the metal film 52b is removed in this manner, the resist pattern 53 is removed.

Next, as illustrated in (d) of FIG. 13, a resist pattern 54 is formed on a remaining metal film 52b. The resist pattern 54 is a pattern for forming the alignment mark 52. A design pattern of the resist pattern 54 is aligned with the alignment mark 51 which serves as a reference.

Next, as illustrated in (e) of FIG. 13, the metal film 52b is removed according to the resist pattern 54. That is, the alignment mark 52 is formed on the glass substrate 503.

Next, as illustrated in (f) of FIG. 13, after the metal film 52b is removed, the resist pattern 54 is removed.

Lastly, as illustrated in (g) of FIG. 13, the protection film 504 is stacked on the glass substrate 503 and the alignment mark 52.

Alternatively, the alignment marks 51 and 52 as shown in FIGS. 11 and 12 can be formed in the following manner. FIG. 14 is a view for describing the steps of forming the alignment marks 51 and 52.

First, as illustrated in (a) of FIG. 14, a metal film 52b is stacked on the glass substrate 503. The metal film 52b is stacked under the condition where a stack prevention mask 55 is provided above the alignment region of the color filter substrate 502 so that no metal film 52b is stacked above the alignment region. Since the alignment region of the color filter substrate 502 is hidden behind the stack prevention mask 55 when viewed from above, no metal film 52b is stacked above the alignment region.

Next, as illustrated in (b) of FIG. 14, after the metal film 52b is stacked, the stack prevention mask 55 is removed.

Next, as illustrated in (c) of FIG. 14, a resist pattern 54 is formed on the metal film 52b. The resist pattern 54 is a pattern for forming the alignment mark 52. A design pattern of the resist pattern 54 is aligned with the alignment mark 51 which serves as a reference.

Next, as illustrated in (d) of FIG. 14, the metal film 52b is removed according to the resist pattern 54. That is, the alignment mark 52 is formed on the glass substrate 503.

Next, as illustrated in (e) of FIG. 14, after the metal film 52b is removed, the resist pattern 54 is removed.

Lastly, as illustrated in (f) of FIG. 14, the protection film 504 is stacked on the glass substrate 503 and the alignment mark 52.

Further, there is another kind of the aforementioned liquid crystal display device as below. FIG. 15 is a view schematically illustrating another configuration of the aforementioned liquid crystal display device. As illustrated in FIG. 15, this liquid crystal display device 600 includes a touch panel 605 and a liquid crystal display panel 606. The touch panel 605 is constituted by a protection film 601 and a glass substrate 602. The liquid crystal display panel 606 is constituted by the glass substrate 602, a color filter substrate 603 and a TFT substrate 604.

As illustrated in FIG. 15, the liquid crystal display device 600 is configured such that the touch panel 605 and the liquid crystal display panel 606 are arranged in this order. As described earlier, the touch panel 605 is an in-cell touch panel included in the liquid crystal display panel 606.

According to this configuration, alignment is required between an existing pattern on the protection film 601, which existing pattern is positioned on the back surface-side of the glass substrate 602, and a design pattern under the color filter substrate 603, which design pattern is positioned on the front surface-side of the glass substrate 602. This is to optimally set the relative position of the patterns. The following description discusses the alignment.

FIG. 16 is a view for describing alignment between the back surface-side and the front surface-side of the glass substrate 602. As illustrated in FIG. 16, an alignment mark 61 is provided on the protection film 601. The alignment mark 61 is in the shape of a cross when viewed from above (refer to K in FIG. 16).

A design pattern on the glass substrate 602 is aligned with the alignment mark 61 which serves as a reference.

On the glass substrate 602, a design pattern optimally positioned relative to the alignment mark 61 is formed. The design pattern includes an alignment mark 62. The alignment mark 62 is also in the shape of a cross when viewed from above (refer to L in FIG. 16).

Such alignment marks 61 and 62 can be formed for example in the following manner. FIG. 17 is a view for describing the steps of forming the alignment marks 61 and 62.

First, as illustrated in (a) of FIG. 17, a metal film 62b is stacked on the glass substrate 602. The metal film 62b is stacked on the entire surface of the glass substrate 602.

Next, as illustrated in (b) of FIG. 17, a resist pattern 63 is formed on the metal film 62b. The resist pattern 63 is a pattern for removing the metal film 62b which is stacked above an alignment region where a plurality of alignment marks 61 are provided on the protection film 601. Note that a design pattern of the resist pattern 63 is not aligned with the alignment mark 61 which serves as a reference.

Next, as illustrated in (c) of FIG. 17, the metal film 62b is removed according to the resist pattern 63. That is, the metal film 62b above the alignment region of the protection film 601 is removed. After the metal film 62b is removed in this manner, the resist pattern 63 is removed.

Next, as illustrated in (d) of FIG. 17, a resist pattern 64 is formed on a remaining metal film 62b. The resist pattern 64 is a pattern for forming the alignment mark 62. A design pattern of the resist pattern 64 is aligned with the alignment mark 61 which serves as a reference.

Next, as illustrated in (e) of FIG. 17, the metal film 62b is removed according to the resist pattern 64. That is, the alignment mark 62 is formed on the glass substrate 602.

Next, as illustrated in (f) of FIG. 17, after the metal film 62b is removed, the resist pattern 64 is removed.

Lastly, as illustrated in (g) of FIG. 17, the color filter substrate 603 is formed on the glass substrate 602 and the alignment mark 62.

Alternatively, the alignment marks 61 and 62 as shown in FIGS. 15 and 16 can be formed in the following manner. FIG. 18 is a view for describing the steps of forming the alignment marks 61 and 62.

First, as illustrated in (a) of FIG. 18, a metal film 62b is stacked on the glass substrate 602. The metal film 62b is stacked under the condition where a stack prevention mask 65 is provided above the alignment region of the protection film 601 so that no metal film 62b is stacked above the alignment region. Since the alignment region of the protection film 601 is hidden behind the stack prevention mask 65 when viewed from above, no metal film 62b is stacked above the alignment region.

Next, as illustrated in (b) of FIG. 18, after the metal film 62b is stacked, the stack prevention mask 65 is removed.

Next, as illustrated in (c) of FIG. 18, a resist pattern 64 is formed on the metal film 62b. The resist pattern 64 is a pattern for forming the alignment mark 62. A design pattern of the resist pattern 64 is aligned with the alignment mark 61 which serves as a reference.

Next, as illustrated in (d) of FIG. 18, the metal film 62b is removed according to the resist pattern 64. That is, the alignment mark 62 is formed on the glass substrate 602.

Next, as illustrated in (e) of FIG. 18, after the metal film 62b is removed, the resist pattern 64 is removed.

Lastly, as illustrated in (f) of FIG. 18, the color filter substrate 603 is formed on the glass substrate 602 and the alignment mark 62.

CITATION LIST

Patent Literature

Patent Literature 1
Japanese Patent Application Publication, Tokukai, No. 2008-9054 A (Publication Date: Jan. 7, 2008)

SUMMARY OF INVENTION

Technical Problem

However, the aforementioned liquid crystal display device can be improved further to reduce the number of steps and material costs.

For example, as illustrated in FIG. 12, alignment is required between the existing pattern on the color filter 502, which existing pattern is positioned on the back surface-side of the glass substrate 503, and the design pattern under the protection film 504, which design pattern is positioned on the front surface-side of the glass substrate 503.

In this regard, in order to carry out such alignment, it is necessary to remove the metal film 52b stacked above the alignment region of the color filter substrate 502 so that the alignment mark 51 provided on the back surface-side of the glass substrate 503 is detectable (see (b) and (c) of FIG. 13).

Further, as illustrated in (a) of FIG. 14, it is necessary to separately prepare the stack prevention mask 55. It is needless to say that the number of steps and material costs for the stack prevention mask 55 are preferably reduced.

The same is true with the case as shown in FIG. 16.

In view of the above problems, an object of the present invention is to provide a liquid crystal display device capable of reducing the number of steps and material costs and a method of producing the liquid crystal display device.

Solution to Problem

In order to attain the above object, a liquid crystal display device of the present invention includes: a touch panel; and a liquid crystal display panel, out of the touch panel and the liquid crystal display panel, one panel serving as a reference for alignment between the touch panel and the liquid crystal display panel and the other panel being aligned with the one panel, the other panel being provided with a second alignment mark that is aligned with a first alignment mark of the one panel, and the second alignment mark being constituted by a transparent member.

The liquid crystal display device makes it possible, when patterning the transparent member so that the transparent member is aligned with the first alignment mark, to detect the pre-formed first alignment mark through the transparent member and to pattern the transparent member with reference to the first alignment mark thus detected.

This makes it unnecessary to carry out the step of removing part of a member that constitutes the second alignment mark before the patterning with reference to the pre-formed first alignment mark, which step has been necessary for conventional techniques. Accordingly, it is possible to reduce the number of steps and material costs for the liquid crystal display device.

A method of producing a liquid crystal display device of the present invention is a method of producing the liquid crystal display device configured such that: out of a touch panel and a liquid crystal display panel, one panel serves as a reference for alignment between the touch panel and the liquid crystal display panel and the other panel is aligned with the one panel; and the other panel is provided with a second alignment mark that is aligned with a first alignment mark of the one panel, said method including the steps of: providing a transparent member on an entire surface of a transparent substrate that constitutes the other panel; and patterning the transparent member so that a transparent member remaining on the transparent substrate is aligned with the first alignment mark, thereby allowing the transparent member thus remaining on the transparent substrate to serve as the second alignment mark.

The method of producing the liquid crystal display device makes it possible, when patterning the transparent member so that the transparent member is aligned with the first alignment mark, to detect the pre-formed first alignment mark through the transparent member and to pattern the transparent member with reference to the first alignment mark thus detected.

This makes it unnecessary to carry out the step of removing part of a member that constitutes the second alignment mark before the patterning with reference to the pre-formed first alignment mark, which step has been necessary for conventional techniques. Accordingly, it is possible to reduce the number of steps and material costs for the liquid crystal display device.

A method of producing a liquid crystal display device of the present invention is a method of producing the liquid crystal display device being configured such that: out of a touch panel and a liquid crystal display panel, one panel serves as a reference for alignment between the touch panel and the liquid crystal display panel and the other panel is aligned with the one panel; and the other panel is provided with a second alignment mark that is aligned with a first alignment mark of the one panel, said method including the step of: patterning a transparent substrate that constitutes the other panel so that a protruding part to be formed is aligned with the first alignment mark, thereby allowing the protruding part thus formed on the transparent substrate to serve as the second alignment mark.

The method of producing the liquid crystal display device makes it possible, when patterning the transparent substrate so that the protruding part to be formed is aligned with the first alignment mark, to detect the pre-formed first alignment mark through the transparent substrate and to pattern the transparent substrate with reference to the first alignment mark thus detected.

This makes it unnecessary to carry out the step of removing part of a member that constitutes the second alignment mark before the patterning with reference to the pre-formed first alignment mark, which step has been necessary for conventional techniques. Accordingly, it is possible to reduce the number of steps and material costs for the liquid crystal display device.

Advantageous Effects of Invention

A liquid crystal display device of the present invention includes: a touch panel; and a liquid crystal display panel, out of the touch panel and the liquid crystal display panel, one panel serving as a reference for alignment between the touch panel and the liquid crystal display panel and the other panel being aligned with the one panel, the other panel being provided with a second alignment mark that is aligned with a first alignment mark of the one panel, and the second alignment mark being constituted by a transparent member.

This makes it possible to provide a liquid crystal display device capable of reducing the number of steps and material costs and a method of producing the liquid crystal display device.

DESCRIPTION OF EMBODIMENTS

Figure 1:
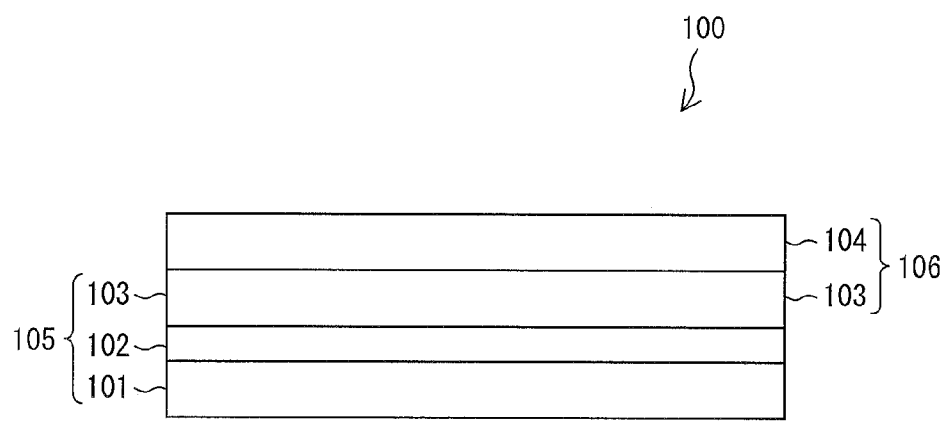
FIG. 1 is a cross-sectional view schematically illustrating a liquid crystal display device of an embodiment of the present invention.

The following description discusses embodiments of the present invention with reference to the drawings. In the drawings referenced in the following descriptions, identical or similar parts are assigned identical or similar referential numerals. Note, however, that the drawings are illustrated schematically. Therefore, relationships between the thicknesses and dimensions viewed from above, and the ratio between the thicknesses of respective layers etc., are different from actual ones. Further, the dimensions and ratios etc. may be shown differently in different drawings.

Embodiment 1

FIG. 1 is a cross-sectional view schematically illustrating a configuration of a liquid crystal display device of Embodiment 1 of the present invention. As illustrated in FIG. 1, a liquid crystal display device 100 of the present embodiment includes a liquid crystal display panel 105 and a touch panel 106.

The liquid crystal display panel 105 is constituted by a TFT substrate 101, a color filter substrate 102 and a glass substrate 103. The touch panel 106 is constituted by the glass substrate 103 and a protection film 104.

On the back surface-side (one main surface-side) of the glass substrate 103, the TFT substrate 101 and the color filter substrate 102 are provided. On the front surface-side (the other main surface-side) of the glass substrate 103, the protection film 104 is provided.

That is, the liquid crystal display panel 105 is constituted by (i) the glass substrate 103 and (ii) the TFT substrate 101 and the color filter substrate 102 which are provided on the back surface-side of the glass substrate 103. Further, the touch panel 106 is constituted by (a) the glass substrate 103 and (b) the protection film 104 provided on the front surface-side of the glass substrate 103.

The liquid crystal display device 100 is configured such that the liquid crystal display panel 105 and the touch panel 106 are arranged in this order. The touch panel 106 is an in-cell touch panel included in the liquid crystal display panel 105.

The TFT substrate 101 is constituted by a transparent insulating substrate such as glass. On this substrate, TFTs and pixel electrodes are arranged in a matrix manner.

The color filter substrate 102 is constituted by an insulating substrate such as glass. On this substrate, a plurality of black matrices (BM) and color filters provided in regions separated by the black matrices are arranged on the glass substrate 103-side.

Further, a liquid crystal layer (not illustrated) is sandwiched between the TFT substrate 101 and the color filter 102, in which liquid crystal layer a liquid crystal material is enclosed.

According to the configuration, alignment is required between an existing pattern on the color filter substrate 102, which existing pattern is positioned on the back surface-side of the glass substrate 103, and a design pattern under the protection film 104, which design pattern is positioned on the front surface-side of the glass substrate 103. This is to optimally set the relative position of the patterns. The following description discusses the alignment.

Figure 2:
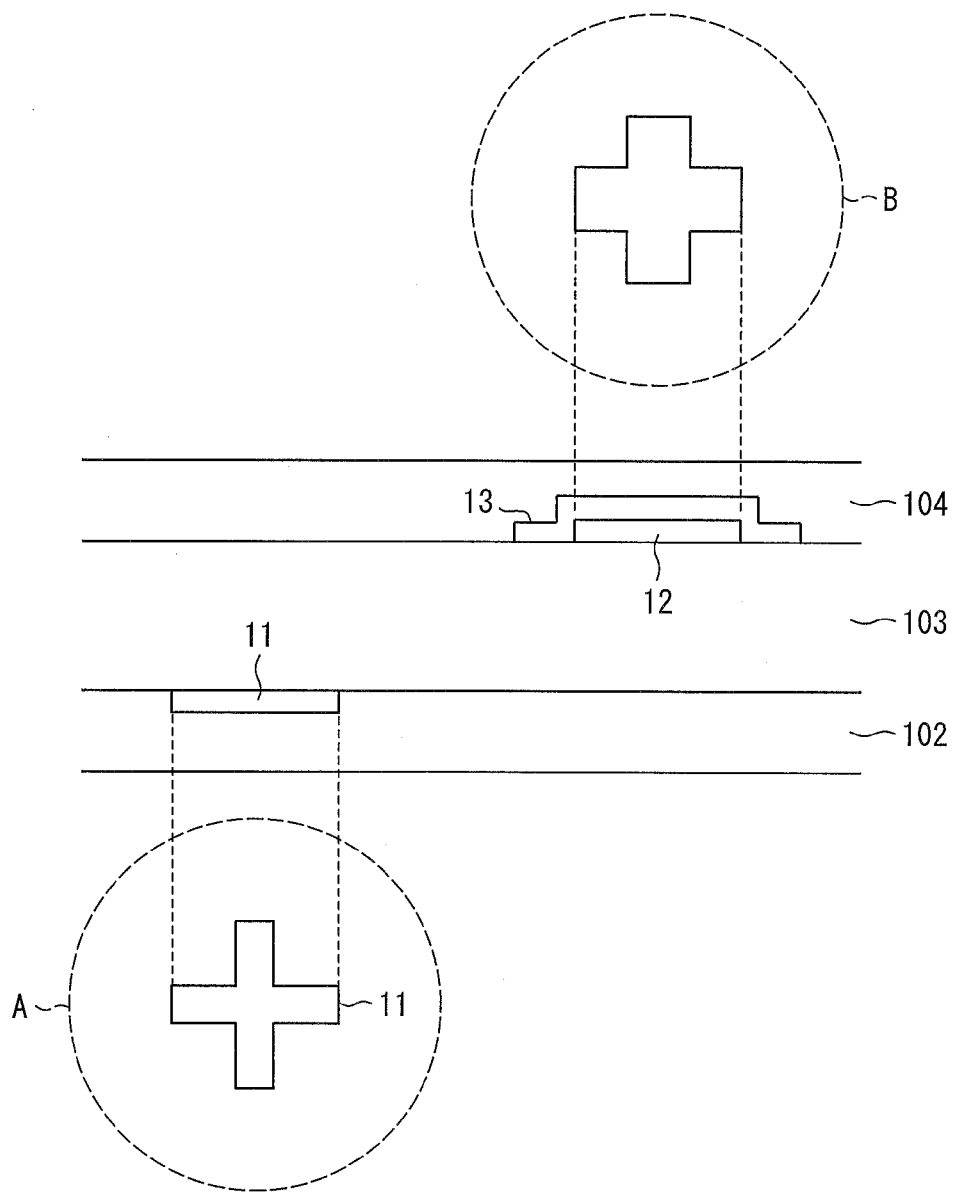
FIG. 2 is a view for describing alignment between the back surface-side and the front surface-side of a glass substrate of the liquid crystal display device.

FIG. 2 is a view for describing alignment between the back surface-side and the front surface-side of the glass substrate 103. As illustrated in FIG. 2, an alignment mark (first alignment mark) 11 is provided on the color filter substrate 102. The alignment mark 11 is in the shape of a cross when viewed from above (refer to A in FIG. 2). The alignment mark 11 is 50 µm×50 µm in size.

It is needless to say that the shape of the alignment mark 11 viewed from above is not limited to the shape of a cross. For example, the alignment mark 11 may be in the shape of a rectangle (50 µm×50 µm in size) or in the shape of a circle (50 µm in diameter) when viewed from above. That is, the shape and the size of the alignment mark 11 viewed from above may be suitably selected according to how the alignment mark 11 is to be detected.

The alignment mark 11 may be made from for example a metal film for the black matrices arranged on the color filter substrate 102. This makes it unnecessary to stack a separate metal film for forming the alignment mark 11. Accordingly, it is possible to further reduce the number of steps and material costs for the liquid crystal display device 100.

A design pattern on the glass substrate 103 is aligned with the alignment mark 11 which serves as a reference.

On the glass substrate 103, a design pattern optimally positioned relative to the alignment mark 11 is formed. The design pattern includes an alignment mark (second alignment mark) 12. The alignment mark 12 is also in the shape of a cross when viewed from above (refer to B in FIG. 2).

It is needless to say that the shape of the alignment mark 12 viewed from above is not limited to the shape of a cross, as is the case with the foregoing alignment mark 11. For example, the alignment mark 12 may be in the shape of a rectangle (50 μm×50 μm) or in the shape of a circle (50 μm in diameter) when viewed from above. That is, the shape and the size of the alignment mark 12 viewed from above may be suitably selected according to how the alignment mark 12 is to be detected.

According to the liquid crystal display device 100, the alignment mark 12 is constituted by a known transparent conductive film (transparent member) such as ITO, IZO or ZnO. On the alignment mark 12, an opaque film (opaque member) 13 is provided (described later).

The opaque film 13 may be in any shape when viewed from above, provided that the opaque film 13 is in the shape that at least entirely covers the alignment mark 12 when viewed from above.

Figure 3:
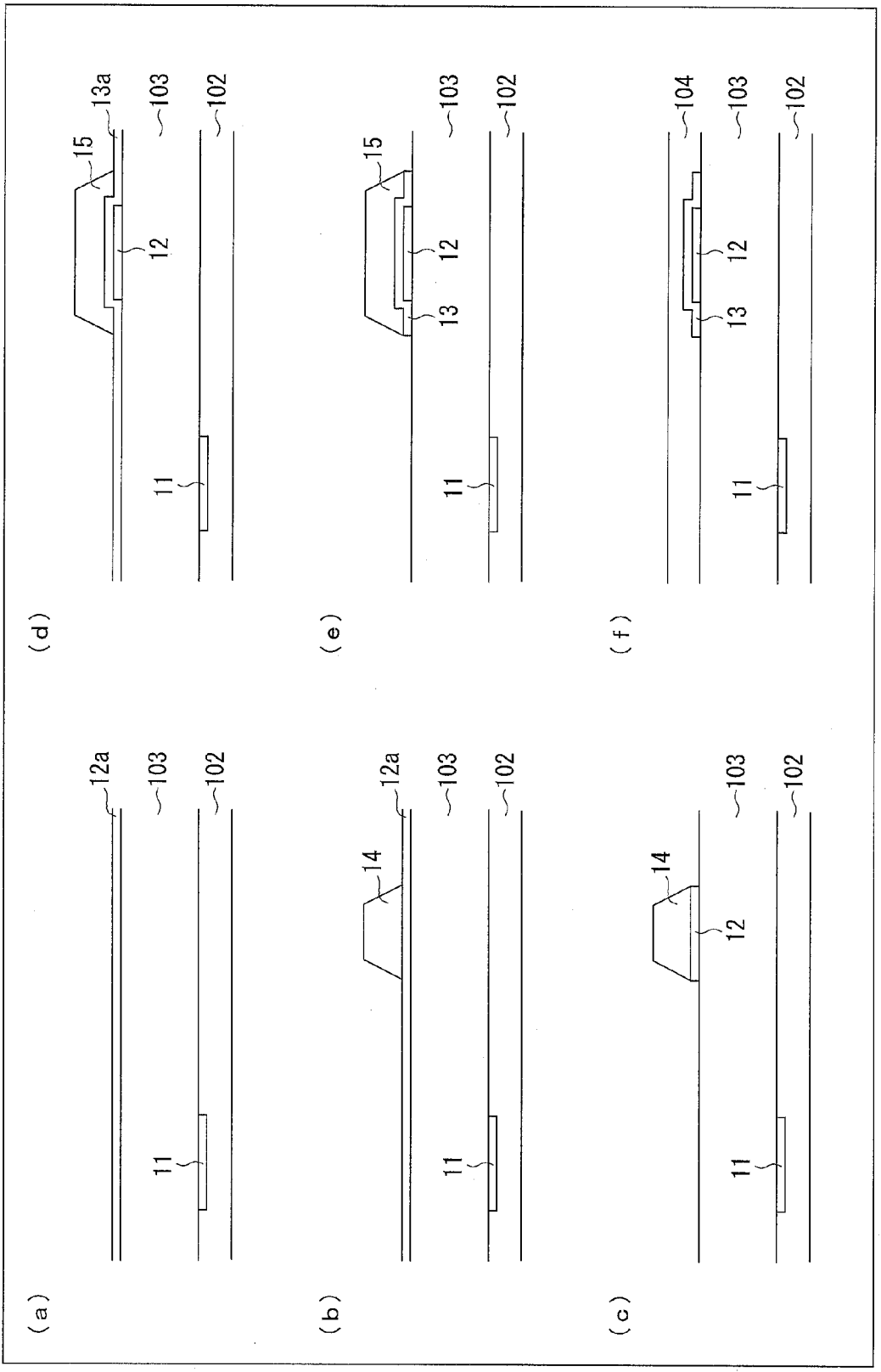
FIG. 3 is a view illustrating the steps of a method for producing the liquid crystal display device. (a) to (f) of FIG. 3 are cross-sectional views showing how the liquid crystal display device looks after the respective steps are carried out.

The following description discusses the steps of forming the alignment mark 11, the alignment mark 12 and the opaque film 13. FIG. 3 is a view for describing the steps of forming the alignment mark 11, the alignment mark 12 and the opaque film 13.

First, as illustrated in (a) of FIG. 3, a transparent conductive film 12a is stacked on the glass substrate 103. The transparent conductive film 12a is stacked on the entire surface of the glass substrate 103.

The transparent conductive film 12a may be for example made from a touch electrode transparent conductive film that constitutes the touch panel 106. The touch electrode transparent conductive film is a film formed on the glass substrate 103. This makes it unnecessary to stack a separate transparent conductive film for forming the alignment mark 12. Accordingly, it is possible to further reduce the number of steps and material costs for the liquid crystal display device 100.

Next, as illustrated in (b) of FIG. 3, a resist pattern 14 is formed on the transparent conductive film 12a. The resist pattern 14 is a pattern for forming the alignment mark 12. A design pattern of the resist pattern 14 is aligned with the alignment mark 11 which serves as a reference.

Figure 13:
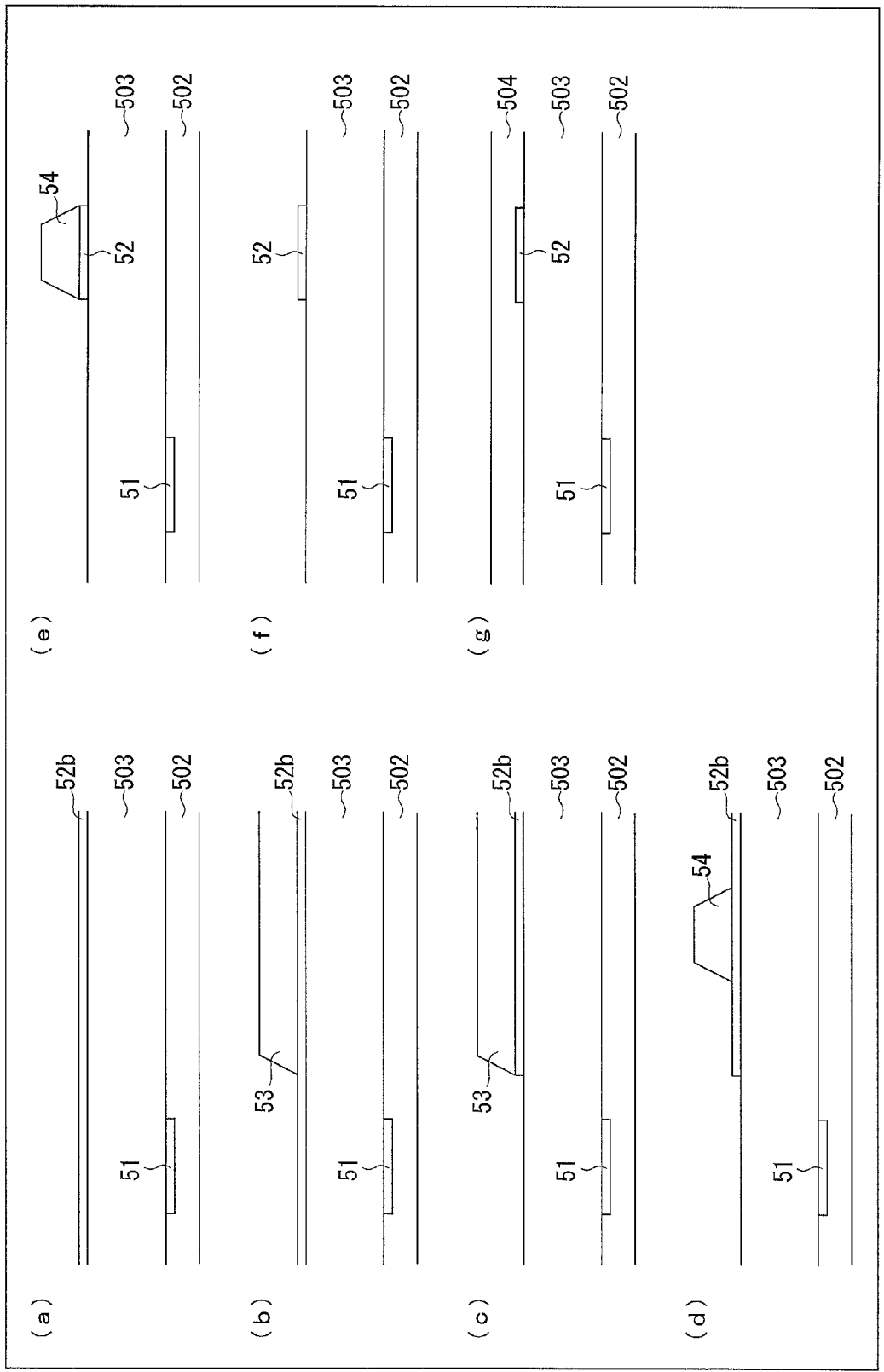
FIG. 13 is a view illustrating the steps of a method for producing the liquid crystal display device. (a) to (g) of FIG. 13 are cross-sectional views showing how the liquid crystal display device looks after the respective steps are carried out.
Figure 14:
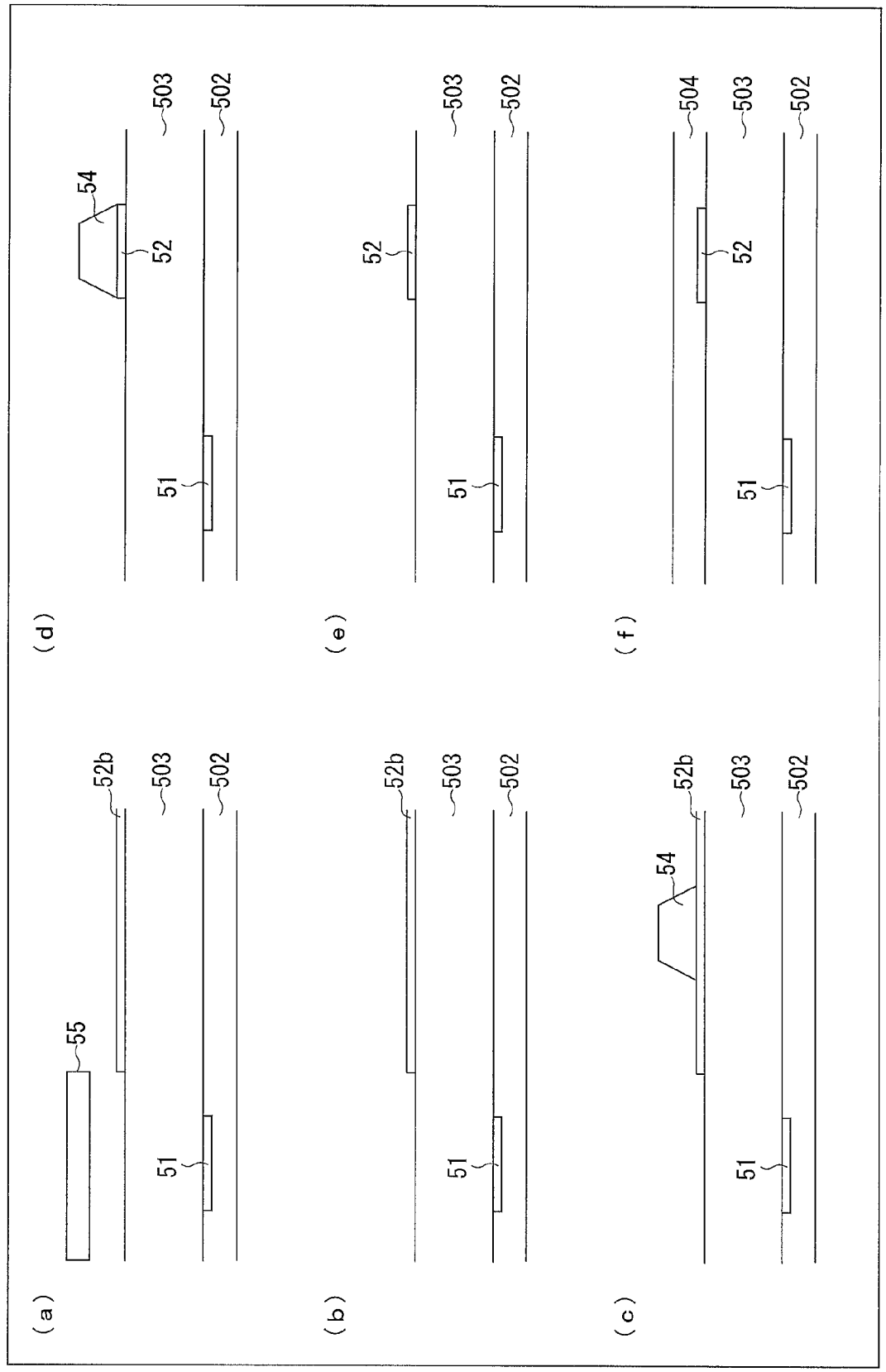
FIG. 14 is a view illustrating the steps of another method for producing the liquid crystal display device. (a) to (f) of FIG. 14 are cross-sectional views showing how the liquid crystal display device looks after the respective steps are carried out.
Figure 15:
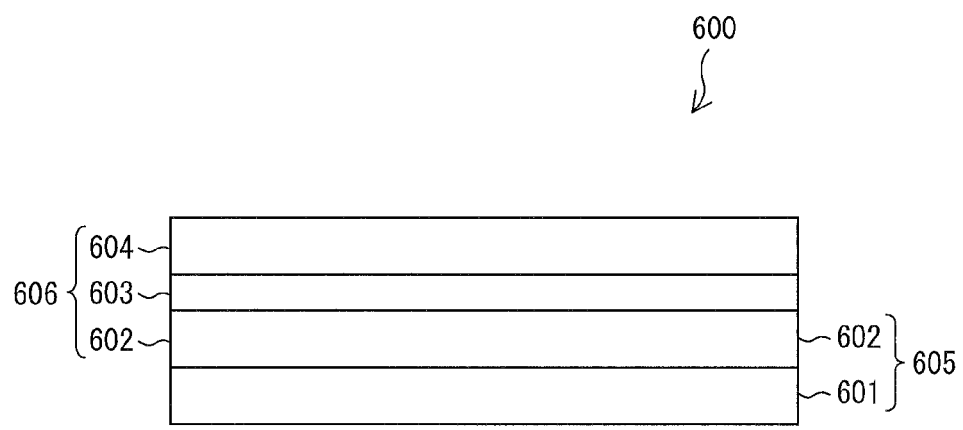
FIG. 15 is a cross-sectional view schematically illustrating a configuration of a conventional liquid crystal display device.
Figure 16:
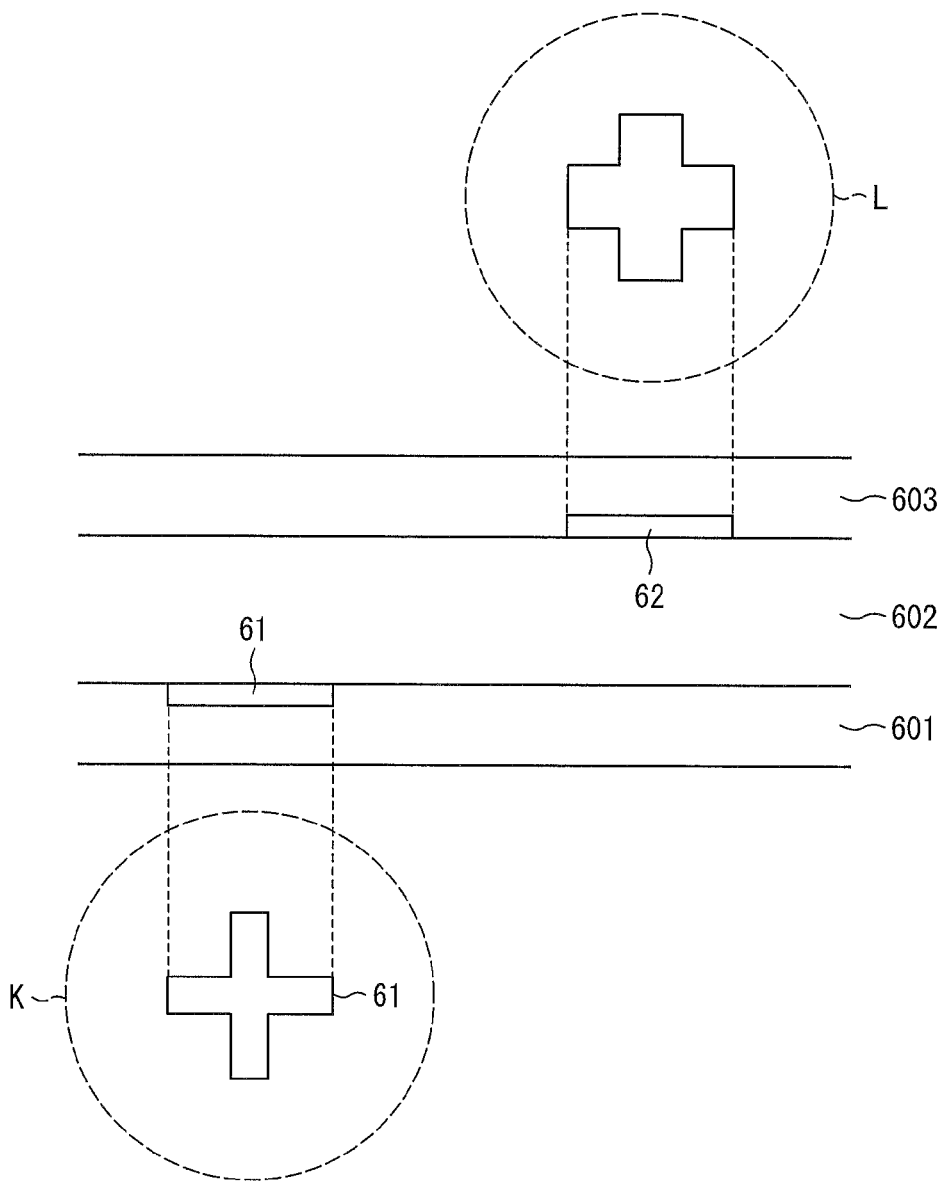
FIG. 16 is a view for describing alignment between the back surface-side and the front surface-side of the glass substrate of the liquid crystal display device.
Figure 17:
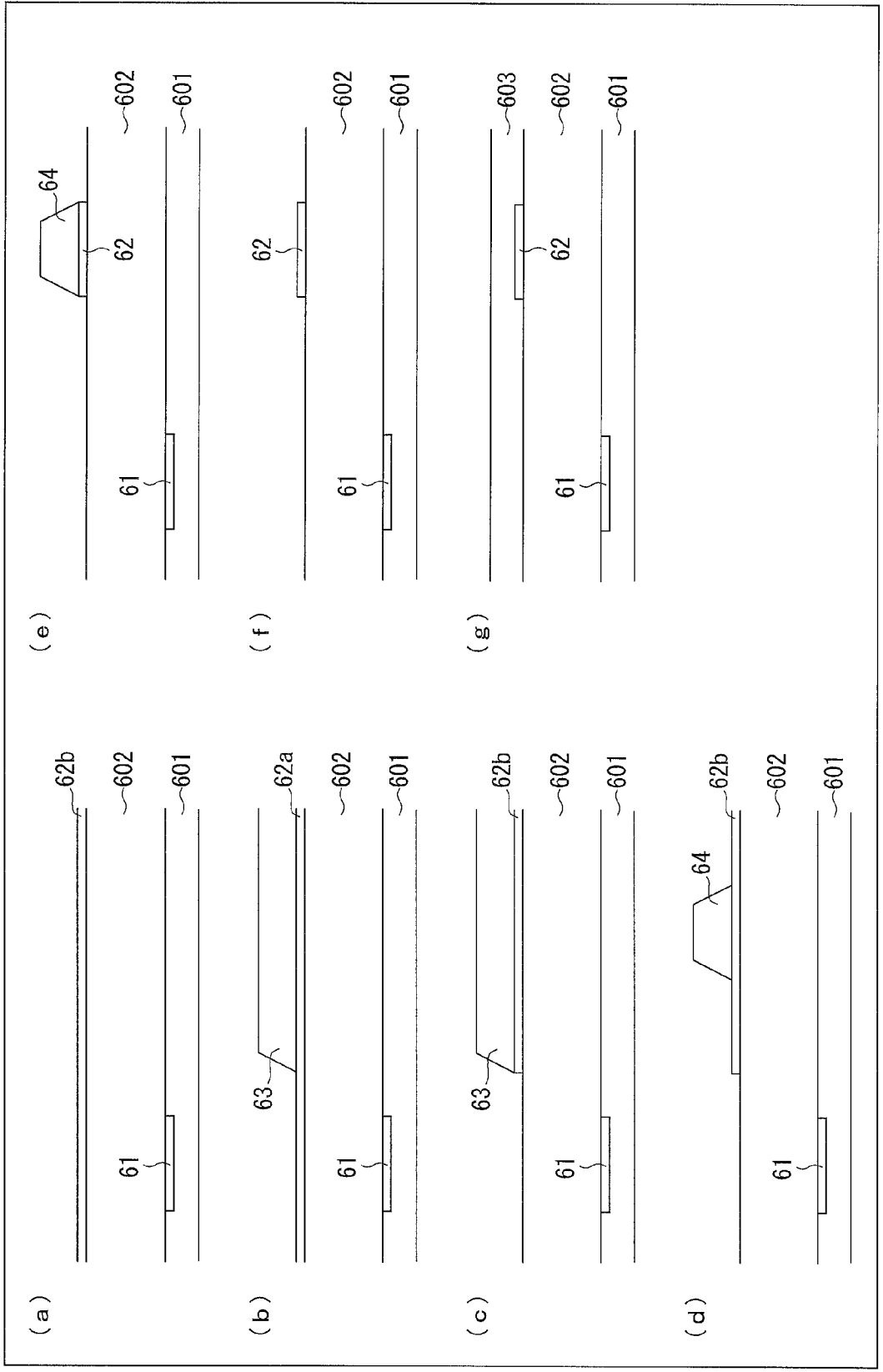
FIG. 17 is a view illustrating the steps of a method for producing the liquid crystal display device. (a) to (g) of FIG. 17 are cross-sectional views showing how the liquid crystal display device looks after the respective steps are carried out.
Figure 18:
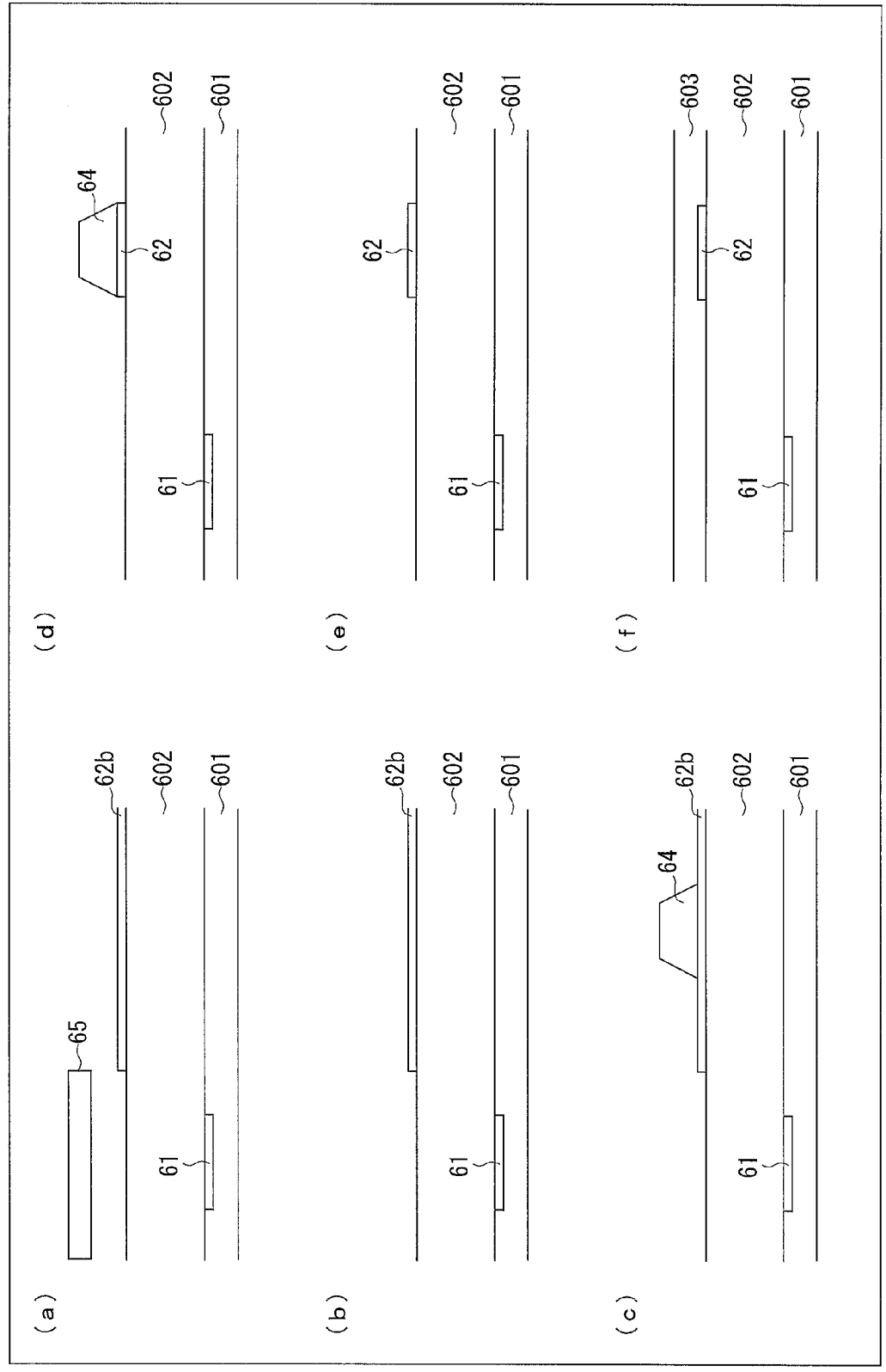
FIG. 18 is a view illustrating the steps of another method for producing the liquid crystal display device. (a) to (f) of FIG. 18 are cross-sectional views showing how the liquid crystal display device looks after the respective steps are carried out.

Note here that, according to the conventional liquid crystal display device 500, the resist pattern 53 is formed on the metal film 52b (see (b) of FIG. 13). The resist pattern 53 is a pattern for removing the metal film 52b, which is stacked above the alignment region of the color filter substrate 502.

This is because, under the condition where the metal film 52b is stacked on the entire surface of the glass substrate 503, it is not possible to detect the alignment mark 51 on the color filter substrate 502.

That is, as described earlier, the conventional liquid crystal display device 500 requires the step of removing the metal film 52b, which is stacked above the alignment region of the color filter substrate 502, in order to align the design pattern on the glass substrate 503 with the alignment mark 51 which serves as a reference.

This is very problematic in reducing the number of steps and material costs for the liquid crystal display device 500.

In contrast, according to the liquid crystal display device 100, since the alignment mark 12 is constituted by the transparent conductive film 12a, it is possible to detect the alignment mark 11 through the transparent conductive film 12a stacked on the entire surface of the glass substrate 103, and thus possible to align the design pattern on the glass substrate 103 with the alignment mark 11 which serves as a reference (see (b) of FIG. 3).

This makes it unnecessary to carry out the step of removing the metal film 52b for detection of the alignment mark 51 (see (b) of FIG. 13), and thus makes it possible to reduce the number of steps and material costs for the liquid crystal display device 100.

Next, as illustrated in (c) of FIG. 3, the transparent conductive film 12a is removed according to the resist pattern 14. That is, the alignment mark 12 is formed on the glass substrate 103.

Next, as illustrated in (d) of FIG. 3, a metal film 13a is stacked on the glass substrate 103 and the alignment mark 12. The metal film 13a is stacked on the entire surface of the glass substrate 103. After the metal film 13a is stacked, a resist pattern 15 is formed on the metal film 13a.

The metal film 13a is a film for making opaque the alignment mark 12 constituted by the transparent conductive film 12a. As is the case with the alignment mark 11, a design pattern above the alignment mark 12 is aligned with the alignment mark 12 which serves as a reference. Therefore, the alignment mark 12 needs to be made opaque so as to be detectable.

The metal film 13a may be made from for example a metal film for metal wires that constitute the touch panel 106, which metal wires are provided on the glass substrate 103. This makes it unnecessary to stack a separate metal film to make the alignment mark 12 opaque, and thus possible to further reduce the number of steps and material costs for the liquid crystal display device 100.

Next, as illustrated in (d) of FIG. 3, the resist pattern 15 is formed on the metal film 13a. The resist pattern 15 is a pattern for forming the opaque film 13 which makes the alignment mark 12 opaque. A design pattern of the resist pattern 15 is aligned with for example the alignment mark 12 which serves as a reference. It is needless to say that the design pattern of the resist pattern 15 may be aligned with the alignment mark 11 which serves as a reference.

As described earlier, the opaque film 13 may be in any shape when viewed from above, provided that the opaque film 13 is in the shape that at least entirely covers the alignment mark 12 when viewed from above. This is because the shape of the alignment mark 12 viewed from above is made opaque and thus becomes detectable if the opaque film 13 viewed from above is in the shape that at least entirely covers the alignment mark 12 when viewed from above.

Next, as illustrated in (e) of FIG. 3, the metal film 13a is removed according to the resist pattern 15. That is, the opaque film 13 is formed on the glass substrate 103. After the metal film 13a is removed, the resist pattern 15 is removed.

Lastly, as illustrated in (f) of FIG. 3, the protection film 104 is stacked on the glass substrate 103 and the opaque film 13.

As has been described, according to the liquid crystal display device 100 of Embodiment 1 of the present invention, since the alignment mark 12 is constituted by the transparent conductive film 12a, it is possible to detect the alignment mark 11 through the transparent conductive film 12a stacked on the entire surface of the glass substrate 103, and thus possible to align the design pattern on the glass substrate 103 with the alignment mark 11 which serves as a reference.

Accordingly, it is unnecessary to carry out the step of removing the transparent conductive film 12a for detection of the alignment mark 11, and thus possible to reduce the number of steps and material costs for the liquid crystal display device 100.

Embodiment 2

The following description discusses Embodiment 2 of the present invention. As is the case with the Embodiment 1, according to the present embodiment, alignment is required between an existing pattern on the color filter substrate 102, which existing pattern is positioned on the back surface-side of the glass substrate (transparent substrate) 103, and a design pattern under the protection film 104, which design pattern is positioned on the front surface-side of the glass substrate 103. This is to optimally set the relative position of the patterns.

Figure 4:
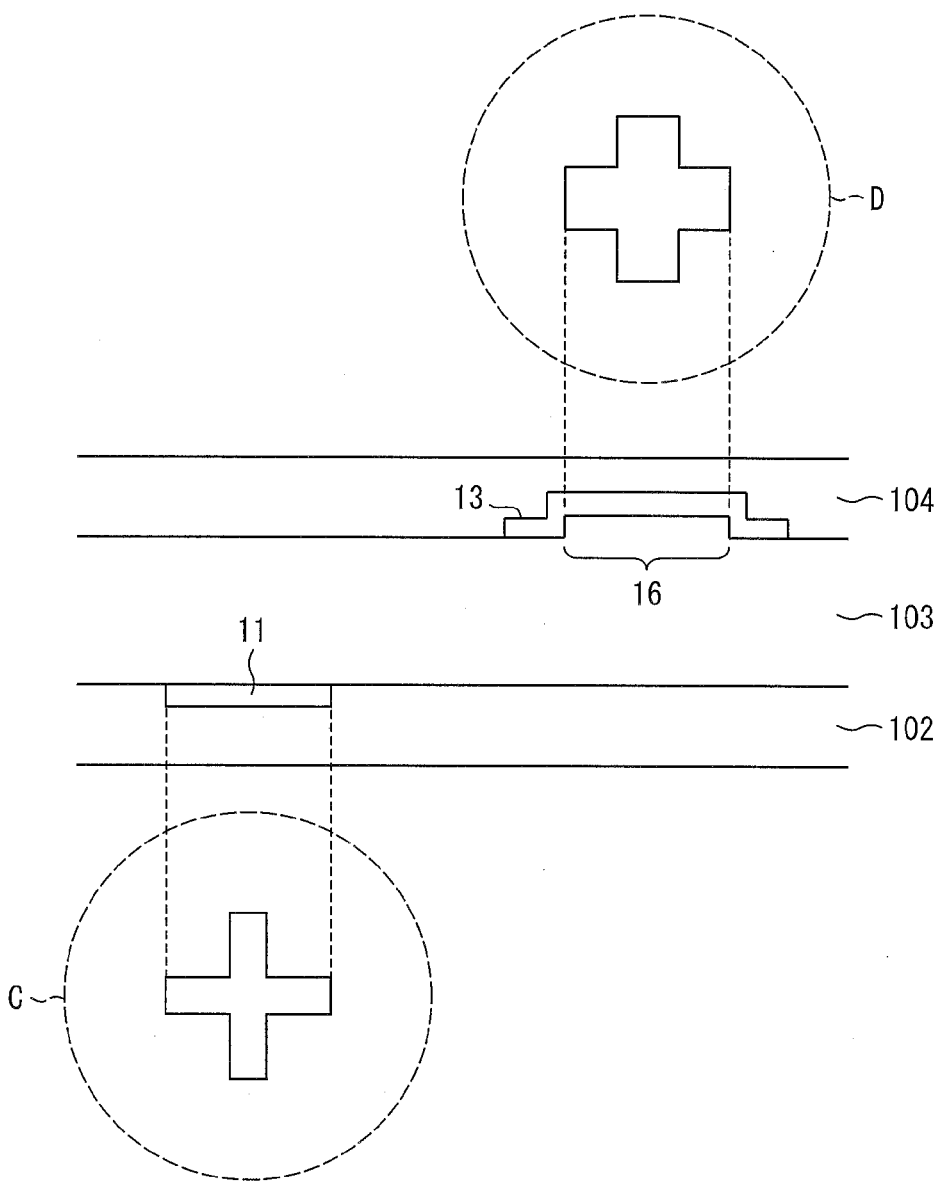
FIG. 4 is a view for describing other alignment between the back surface-side and the front surface-side of the glass substrate of the liquid crystal display device.

The present embodiment is different from the Embodiment 1 in the steps of forming alignment marks for use in alignment. FIG. 4 is a view for describing alignment between the back surface-side and the front surface-side of the glass substrate 103.

As illustrated in FIG. 4, an alignment mark 11 is provided on the color filter substrate 102. The alignment mark 11 is in the shape of a cross when viewed from above (refer to C in FIG. 4). Since the alignment mark 11 is the same as that of the Embodiment 1, its description is omitted here.

On the glass substrate 103, a design pattern optimally positioned relative to the alignment mark 11 is formed. The design pattern includes an alignment mark (second alignment mark) 16. The alignment mark 16 is also in the shape of a cross when viewed from above (refer to D in FIG. 4).

Note here that the alignment mark 16 is different from the alignment mark 12 of the Embodiment 1 in that it is a protrusion (protruding part) formed on the glass substrate 103, which protrusion is part of the glass substrate 103.

The protrusion may be formed for example concurrently with the glass substrate 103 when the glass substrate 103 is formed into a thin film. This makes it unnecessary to separately carry out a step of forming the glass substrate 103 into a thin film to form the alignment mark 16, and thus makes it possible to further reduce the number of steps and material costs for the liquid crystal display device 100.

As is the case with the foregoing alignment mark 11, the shape of the alignment mark 16 viewed from above is not limited to the shape of a cross. For example, the alignment mark 16 may be in the shape of a rectangle (50 μm×50 μm in size) or in the shape of a circle (50 μm in diameter) when viewed from above. That is, the shape and the size of the alignment mark 16 viewed from above may be suitably selected according to how the alignment mark 16 is to be detected.

As is the case with the Embodiment 1, an opaque film 13 is provided on the alignment mark 16. Since the opaque film 13 is the same as that of the Embodiment 1, its description is omitted here.

Figure 5:
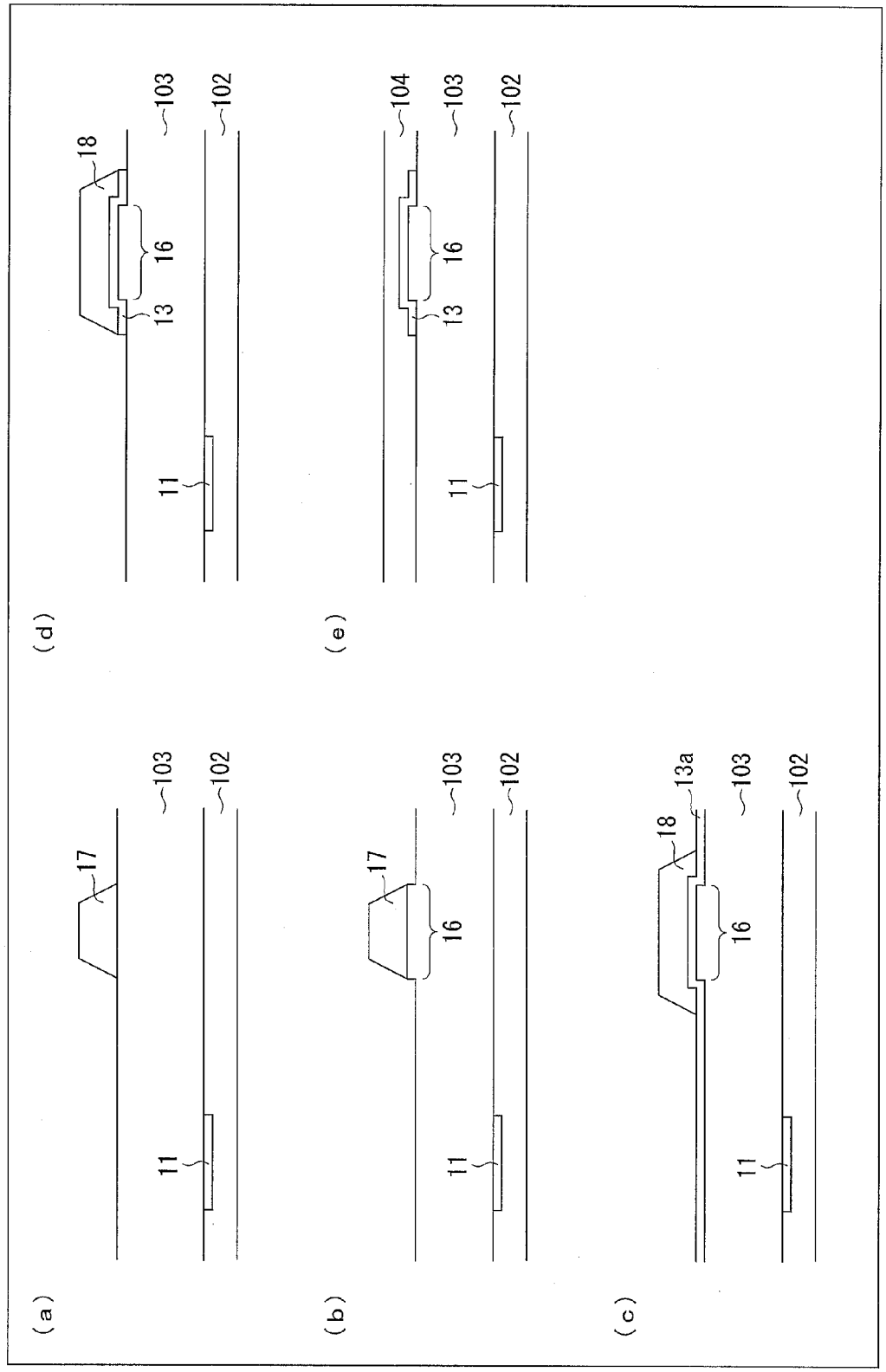
FIG. 5 is a view illustrating the steps of another method for producing the liquid crystal display device. (a) to (e) of FIG. 5 are cross-sectional views showing how the liquid crystal display device looks after the respective steps are carried out.

The following description discusses the steps of forming the alignment mark 11, the alignment mark 16 and the opaque film 13. FIG. 5 is a view for describing the steps of forming the alignment mark 11, the alignment mark 16 and the opaque film 13.

First, as illustrated in (a) of FIG. 5, a resist pattern 17 is formed on the glass substrate 103. The resist pattern 17 is a pattern for forming the alignment mark 16. A design pattern of the resist pattern 17 is aligned with the alignment mark 11 which serves as a reference.

Next, as illustrated in (b) of FIG. 5, the glass substrate 103 is removed according to the resist pattern 17. That is, the alignment mark 16, which is constituted by a protrusion that is part of the glass substrate 103, is formed on the glass substrate 103.

Next, as illustrated in (c) of FIG. 5, a metal film 13a is stacked on the glass substrate 103 and the alignment mark 16. After the metal film 13a is stacked, a resist pattern 18 is formed on the metal film 13a. Since the metal film 13a is the same as that of the Embodiment 1, its description is omitted here.

Then, the resist pattern 18 is formed on the metal film 13a. The resist pattern 18 is a pattern for forming an opaque film 13 which makes the alignment mark 16 opaque. A design pattern of the resist pattern 18 is aligned with for example the alignment mark 16 which serves as a reference. It is needless to say that the design pattern of the resist pattern 18 may be aligned with the alignment mark 11 which serves as a reference.

Next, as illustrated in (d) of FIG. 5, the metal film 13a is removed according to the resist pattern 18. That is, the opaque film 13 is formed on the glass substrate 103. After the metal film 13a is removed, the resist pattern 18 is removed.

Lastly, as illustrated in (e) of FIG. 5, the protection film 104 is stacked on the glass substrate 103 and the opaque film 13.

As has been described, according to the liquid crystal display device 100 of Embodiment 2 of the present invention, since the alignment mark 16 is constituted by a protrusion that is part of the glass substrate 103, it is possible to detect the alignment mark 11 through the glass substrate 103, and thus possible to align the design pattern on the glass substrate 103 with the alignment mark 11 which serves as a reference.

Accordingly, it is possible to reduce the number of steps and material costs for the liquid crystal display device 100.

Embodiment 3

Figure 6:
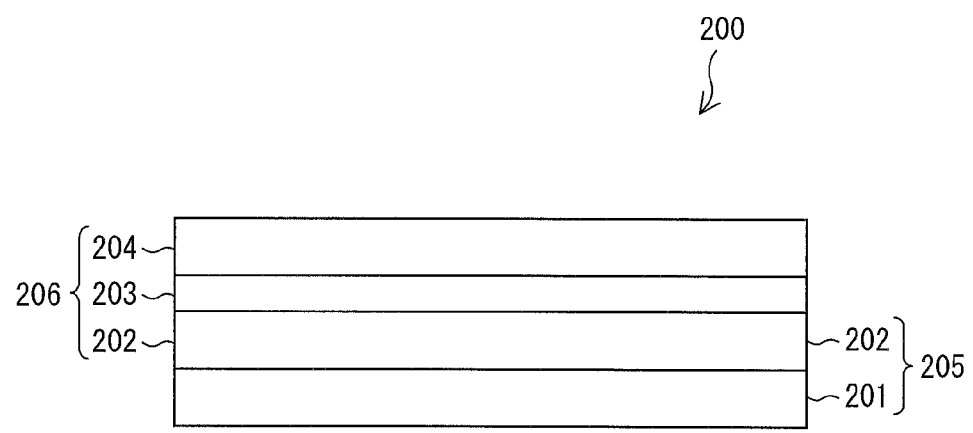
FIG. 6 is a cross-sectional view schematically illustrating a configuration of a liquid crystal display device of another embodiment of the present invention.

The following description discusses Embodiment 3 of the present invention. FIG. 6 is a cross-sectional view schematically illustrating a configuration of a liquid crystal display device of Embodiment 3 of the present invention. As illustrated in FIG. 6, a liquid crystal display device 200 of the present embodiment includes a touch panel 205 and a liquid crystal display panel 206.

The touch panel 205 is constituted by a protection film 201 and a glass substrate 202. The liquid crystal display panel 206 is constituted by the glass substrate 202, a color filter substrate 203 and a TFT substrate 204.

On the back surface-side (one main surface-side) of the glass substrate 202, the protection film 201 is provided. On the front surface-side (the other main surface-side) of the glass substrate 202, the color filter substrate 203 and the TFT substrate 204 are provided.

That is, the touch panel 205 is constituted by (i) the glass substrate 202 and (ii) the protection film 201 provided on the back surface-side of the glass substrate 202. Further, the liquid crystal display panel 206 is constituted by (a) the glass substrate 202 and (b) the color filter substrate 203 and the TFT substrate 204 which are provided on the front surface-side of the glass substrate 202.

The liquid crystal display device 200 is configured such that the touch panel 205 and the liquid crystal display panel 206 are arranged in this order. The touch panel 205 is an in-cell touch panel included in the liquid crystal display panel 206.

The color filter substrate 203 is constituted by an insulating substrate such as glass. On this substrate, a plurality of black matrices (BM) and color filters provided in regions separated by the black matrices are arranged on the glass substrate 202-side.

The TFT substrate 204 is constituted by a transparent insulating substrate such as glass. On this substrate, TFTs and pixel electrodes are arranged in a matrix manner.

Further, a liquid crystal layer (not illustrated) is sandwiched between the color filter substrate 203 and the TFT substrate 204, in which liquid crystal layer a liquid crystal material is enclosed.

According to the configuration, alignment is required between an existing pattern on the protection film 201, which existing pattern is positioned on the back surface-side of the glass substrate 202, and a design pattern under the color filter substrate 203, which design pattern is positioned on the front surface-side of the glass substrate 202. This is to optimally set the relative position of the patterns. The following description discusses the alignment.

Figure 7:
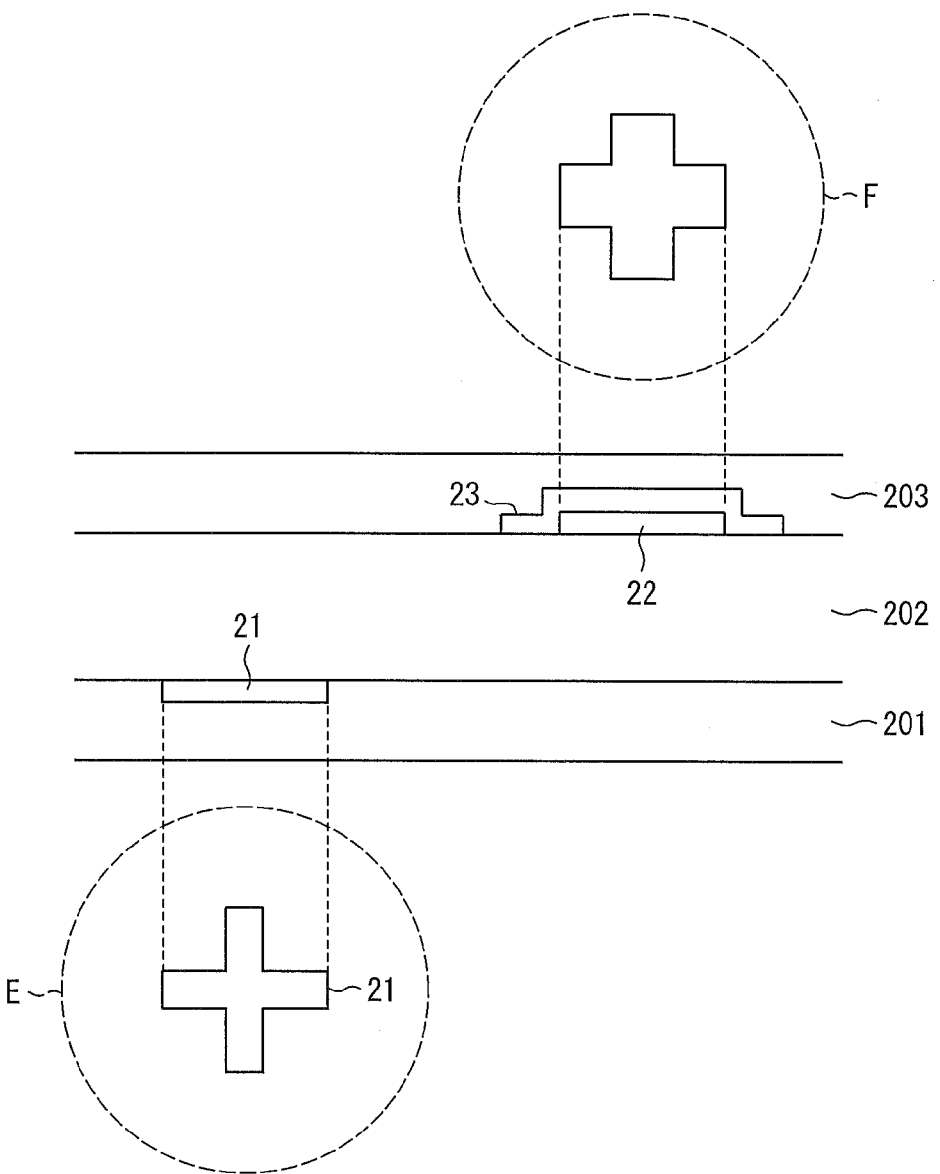
FIG. 7 is a view for describing alignment between the back surface-side and the front surface-side of the glass substrate of the liquid crystal display device.

FIG. 7 is a view for describing alignment between the back surface-side and the front surface-side of the glass substrate 202. As illustrated in FIG. 7, an alignment mark (first alignment mark) 21 is provided on the protection film 201. The alignment mark 21 is in the shape of a cross when viewed from above (refer to E in FIG. 7). The alignment mark 21 is 50 µm×50 µm in size.

It is needless to say that the shape of the alignment mark 21 viewed from above is not limited to the shape of a cross. For example, the alignment mark 21 may be in the shape of a rectangle (50 µm×50 µm in size) or in the shape of a circle (50 µm in diameter) when viewed from above. That is, the shape and the size of the alignment mark 21 viewed from above may be suitably selected according to how the alignment mark 21 is to be detected.

The alignment mark 21 may be made from for example a metal film for metal wires that constitute the touch panel 205, which metal film is provided on the protection film 201. This makes it unnecessary to stack a separate metal film for forming the alignment mark 21. Accordingly, it is possible to further reduce the number of steps and material costs for the liquid crystal display device 200.

A design pattern on the glass substrate 202 is aligned with the alignment mark 21 which serves as a reference.

On the glass substrate 202, a design pattern optimally positioned relative to the alignment mark 21 is formed. The design pattern includes an alignment mark (second alignment mark) 22. The alignment mark 22 is also in the shape of a cross when viewed from above (refer to F in FIG. 7).

It is needless to say that the shape of the alignment mark 22 viewed from above is not limited to the shape of a cross, as is the case with the foregoing alignment mark 21. For example, the alignment mark 22 may be in the shape of a rectangle (50 µm×50 µm in size) or in the shape of a circle (50 µm in diameter) when viewed from above. That is, the shape and the size of the alignment mark 22 viewed from above may be suitably selected according to how the alignment mark 22 is to be detected.

According to the liquid crystal display device 200, the alignment mark 22 is constituted by a known transparent resin film (transparent member) such as alkali resin or epoxy resin. On the alignment mark 22, an opaque film (opaque member) 23 is provided (described later).

The opaque film 23 may be in any shape when viewed from above, provided that the opaque film 23 is in the shape that at least entirely covers the alignment mark 22 when viewed from above.

Figure 8:
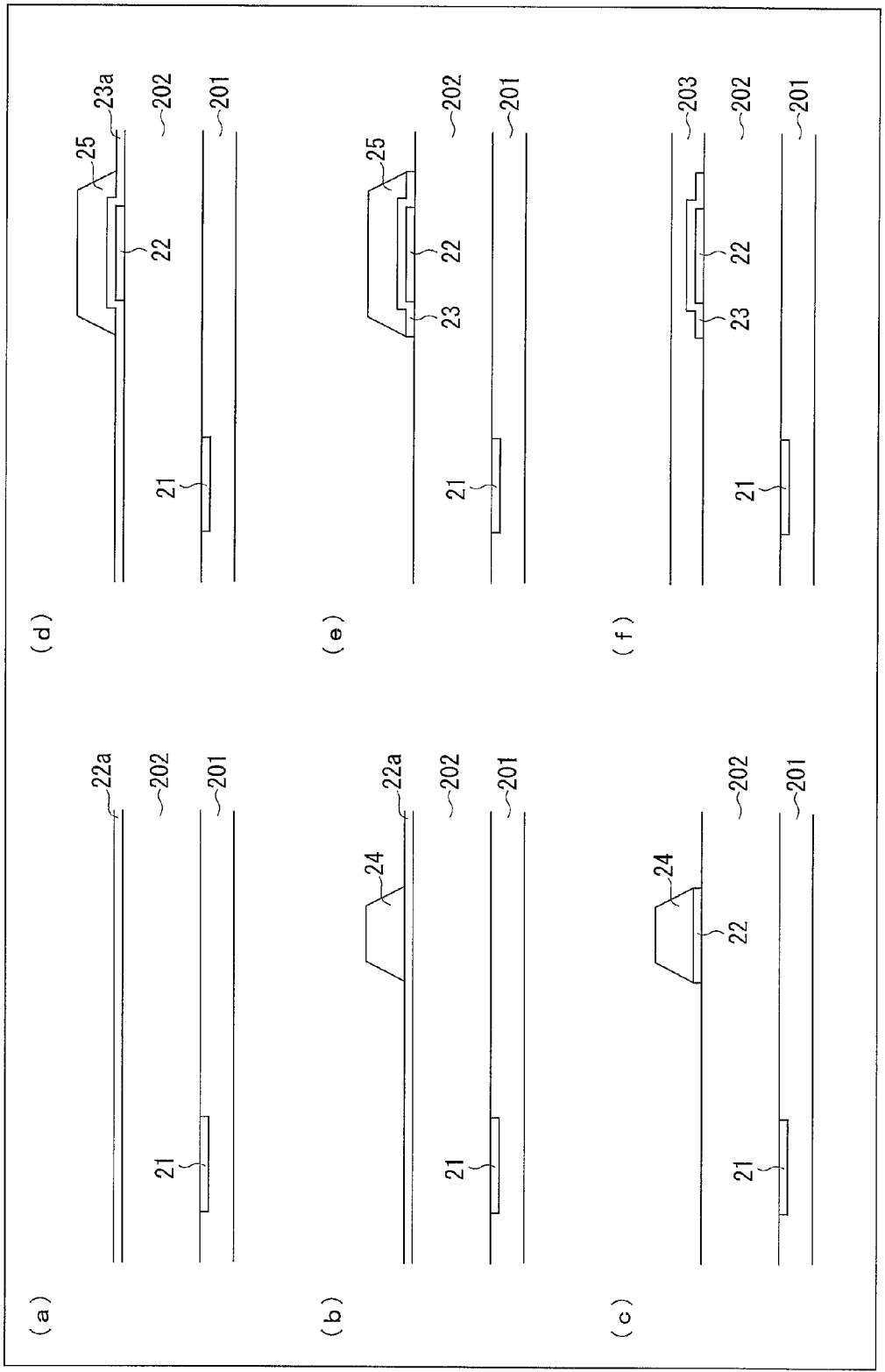
FIG. 8 is a view illustrating the steps of a method for producing the liquid crystal display device. (a) to (f) of FIG. 8 are cross-sectional views showing how the liquid crystal display device looks after the respective steps are carried out.

The following description discusses the steps of forming the alignment mark 21, the alignment mark 22 and the opaque film 23. FIG. 8 is a view for describing the steps of forming the alignment mark 21, the alignment mark 22 and the opaque film 23.

First, as illustrated in (a) of FIG. 8, a transparent resin film 22a is applied to the glass substrate 202. The transparent resin film 22a is applied to the entire surface of the glass substrate 202.

The transparent resin film 22a may be for example made from a light-sensitive transparent resin film that constitutes a pillar of the color filter substrate 203, which transparent resin film is provided on the glass substrate 202. This makes it unnecessary to apply a separate transparent resin film for forming the alignment mark 22. Accordingly, it is possible to further reduce the number of steps and material costs for the liquid crystal display device 200.

Next, as illustrated in (b) of FIG. 8, a resist pattern 24 is formed on the transparent resin film 22a. The resist pattern 24 is a pattern for forming the alignment mark 22. A design pattern of the resist pattern 24 is aligned with the alignment mark 21 which serves as a reference.

According to the liquid crystal display device 200, since the alignment mark 22 is constituted by the transparent resin film 22a, it is possible to detect the alignment mark 21 through the transparent resin film 22a applied to the entire surface of the glass substrate 202, and thus possible to align the design pattern on the glass substrate 202 with the alignment mark 21 which serves as a reference.

Next, as illustrated in (c) of FIG. 8, the transparent resin film 22a is removed according to the resist pattern 24. That is, the alignment mark 22 is formed on the glass substrate 202.

Next, as illustrated in (d) of FIG. 8, a metal film 23a is stacked on the glass substrate 202 and the alignment mark 22. The metal film 23a is stacked on the entire surface of the glass substrate 202. After the metal film 23a is stacked, a resist pattern 25 is formed on the metal film 23a.

The metal film 23a is a film for making opaque the alignment mark 22 constituted by the transparent resin film 22a. As is the case with the alignment mark 21, a design pattern above the alignment mark 22 is aligned with the alignment mark 22 which serves as a reference. Therefore, the alignment mark 22 needs to be made opaque so as to be detectable.

The metal film 23a is for example made from a metal film for the black matrices to be provided on the color filter substrate 203, which metal film is provided on the glass substrate 202. This makes it unnecessary to stack a separate metal film to form the opaque film 23, and thus possible to further reduce the number of steps and material costs for the liquid crystal display device 200.

Then, the resist pattern 25 is formed on the metal film 23a. The resist pattern 25 is a pattern for forming the opaque film 23 which makes the alignment mark 22 opaque. A design pattern of the resist pattern 25 is aligned with for example the alignment mark 22 which serves as a reference. It is needless to say that the design pattern of the resist pattern 25 may be aligned with the alignment mark 21 which serves as a reference.

As described earlier, the opaque film 23 may be in any shape when viewed from above, provided that the opaque film 23 is in the shape that at least entirely covers the alignment mark 22 when viewed from above. This is because the shape of the alignment mark 22 viewed from above is made opaque and thus becomes detectable if the opaque film 23 viewed from above is in the shape that entirely covers the alignment mark 22 when viewed from above.

Next, as illustrated in (e) of FIG. 8, the metal film 23a is removed according to the resist pattern 25. That is, the opaque film 23 is formed on the glass substrate 202. After the metal film 23a is removed, the resist pattern 25 is removed.

Lastly, as illustrated in (f) of FIG. 8, the color filter substrate 203 is formed on the glass substrate 202 and the opaque film 23.

As has been described, according to the liquid crystal display device 200 of Embodiment 3 of the present invention, since the alignment mark 22 is constituted by the transparent resin film 22a, it is possible to detect the alignment mark 21 through the transparent resin film 22a applied to the entire surface of the glass substrate 202, and thus possible to align the design pattern on the glass substrate 202 with the alignment mark 21 which serves as a reference.

This makes it unnecessary to carry out the step of removing the transparent resin film 22a for detection of the alignment mark 21, and thus makes it possible to reduce the number of steps and material costs for the liquid crystal display device 200.

Note that, although the alignment mark 22 is made opaque by coating the alignment mark 22 with the metal film 23a in the present embodiment, this does not imply any limitation on the present invention.

For example, the alignment mark 22 may be made opaque by blackening (subjecting to blackening treatment) the alignment mark 22 made from the transparent resin film 22a by irradiating the alignment mark 22 with laser.

Embodiment 4

The following description discusses Embodiment 4 of the present invention. As is the case with the Embodiment 3, according to the present embodiment, alignment is required between an existing pattern on the protection film 201, which existing pattern is positioned on the back surface-side of the glass substrate 202, and a design pattern under the color filter substrate 203, which design pattern is positioned on the front surface-side of the glass substrate 202. This is to optimally set the relative position of patterns.

Figure 9:
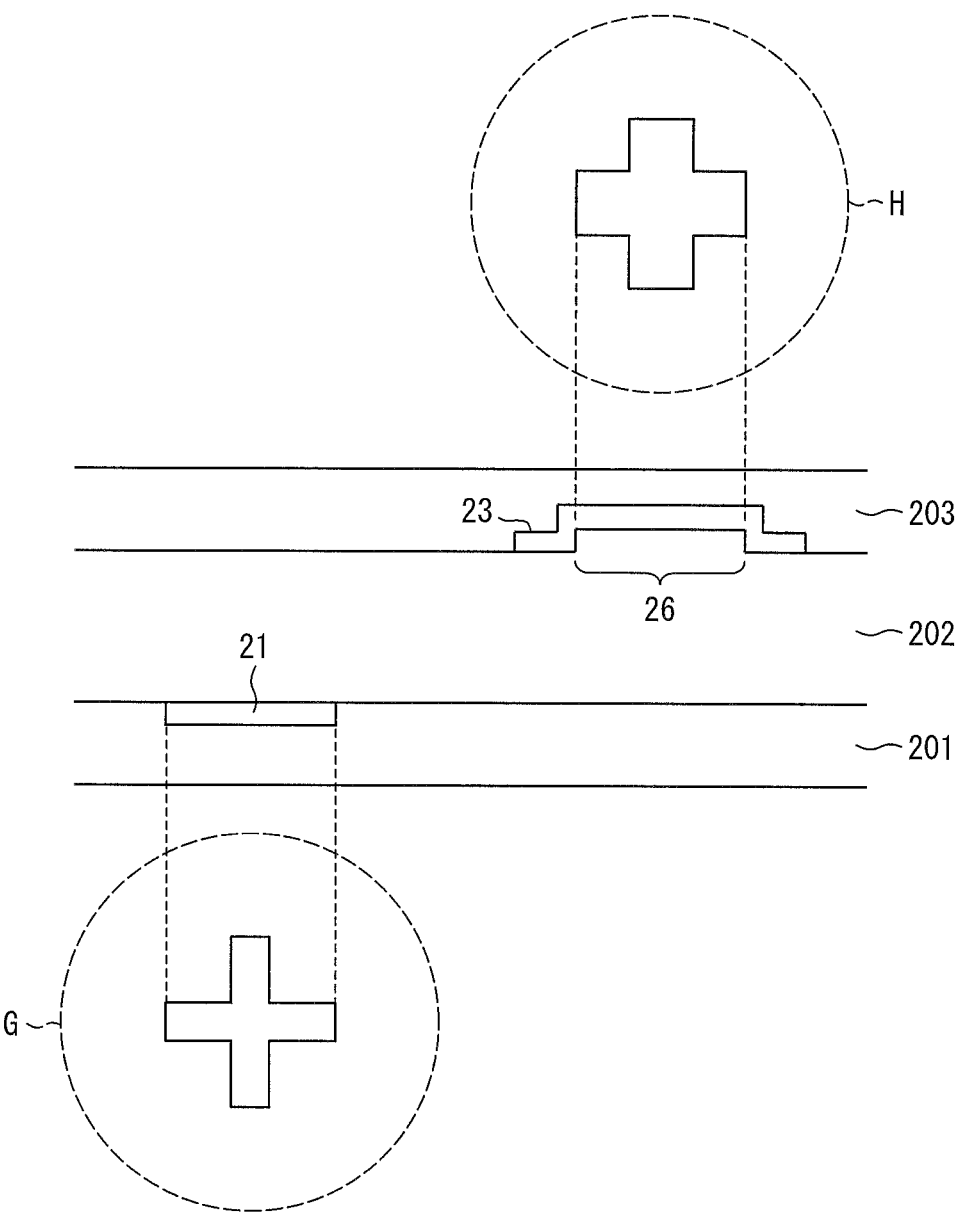
FIG. 9 is a view for describing other alignment between the back surface-side and the front surface-side of the glass substrate of the liquid crystal display device.

The present embodiment is different from the Embodiment 3 in the steps of forming alignment marks for use in alignment. FIG. 9 is a view for describing alignment between the back surface-side and the front surface-side of the glass substrate 202.

As illustrated in FIG. 9, an alignment mark 21 is provided on the protection film 201. The alignment mark 21 is in the shape of a cross when viewed from above (refer to G in FIG. 9). Since the alignment mark 21 is the same as that of the Embodiment 3, its description is omitted here.

On the glass substrate 202, a design pattern optimally positioned relative to the alignment mark 21 is formed. The design pattern includes an alignment mark 26 (second alignment mark). The alignment mark 26 is also in the shape of a cross when viewed from above (refer to H in FIG. 9).

Note here that the alignment mark 26 is different from the alignment mark 22 of the Embodiment 3 in that it is a protrusion formed on the glass substrate 202, which protrusion is part of the glass substrate 202.

The protrusion may be formed for example concurrently with the glass substrate 202 when the glass substrate 202 is formed into a thin film. This makes it unnecessary to separately carry out a step of forming the glass substrate 202 into a thin film to form the alignment mark 26, and thus makes it possible to further reduce the number of steps and material costs for the liquid crystal display device 200.

As is the case with the foregoing alignment mark 21, the shape of the alignment mark 26 viewed from above is not limited to the shape of a cross. For example, the alignment mark 26 may be in the shape of a rectangle (50 µm×50 µm in size) or in the shape of a circle (50 µm in diameter) when viewed from above. That is, the shape and the size of the alignment mark 26 viewed from above may be suitably selected according to how the alignment mark 26 is to be detected.

As is the case with the Embodiment 3, an opaque film 23 is provided on the alignment mark 26. Since the opaque film 23 is the same as that of the Embodiment 3, its description is omitted here.

Figure 10:
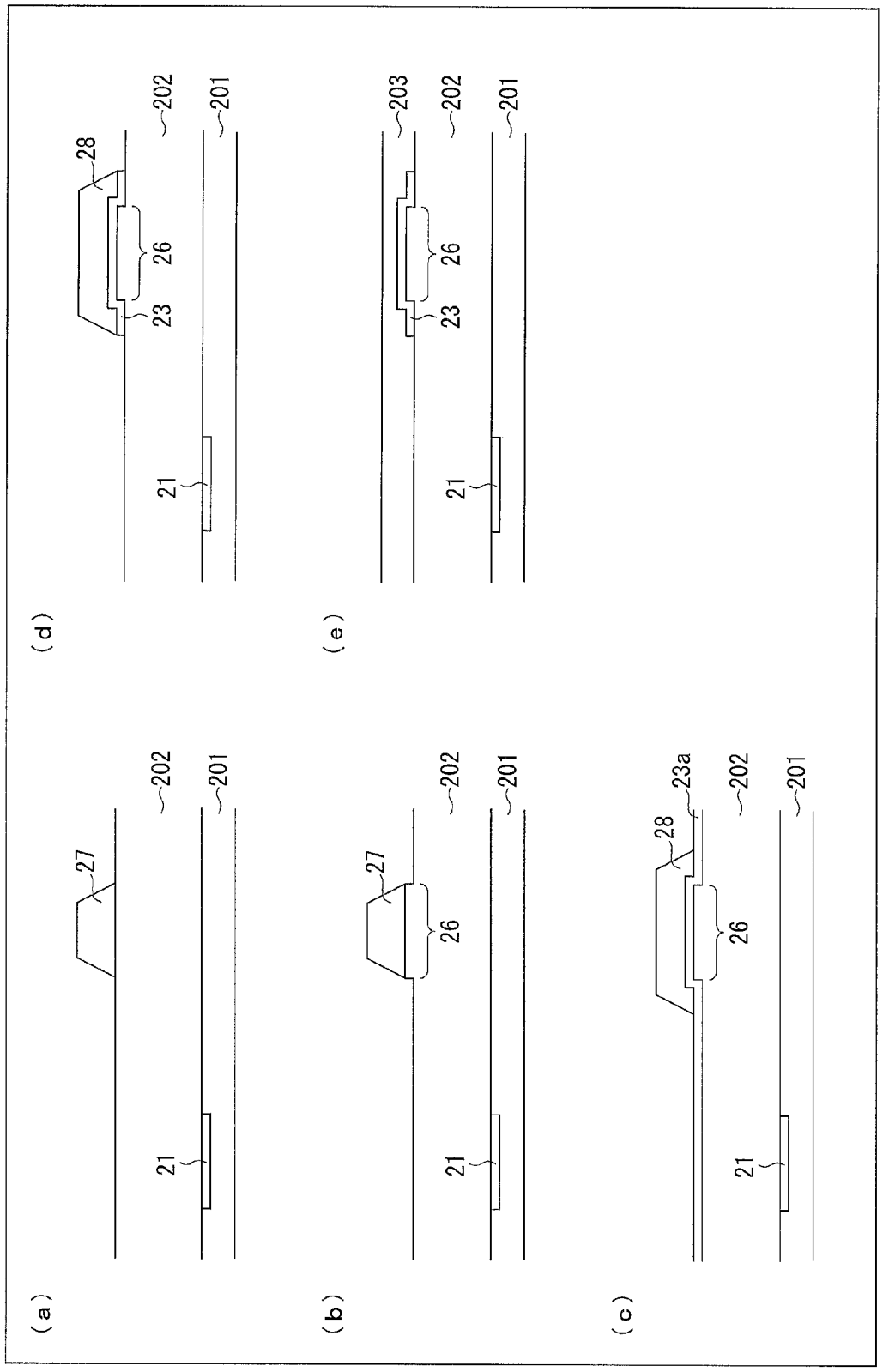
FIG. 10 is a view illustrating the steps of another method for producing the liquid crystal display device. (a) to (e) of FIG. 10 are cross-sectional views showing how the liquid crystal display device looks after the respective steps are carried out.
Figure 11:
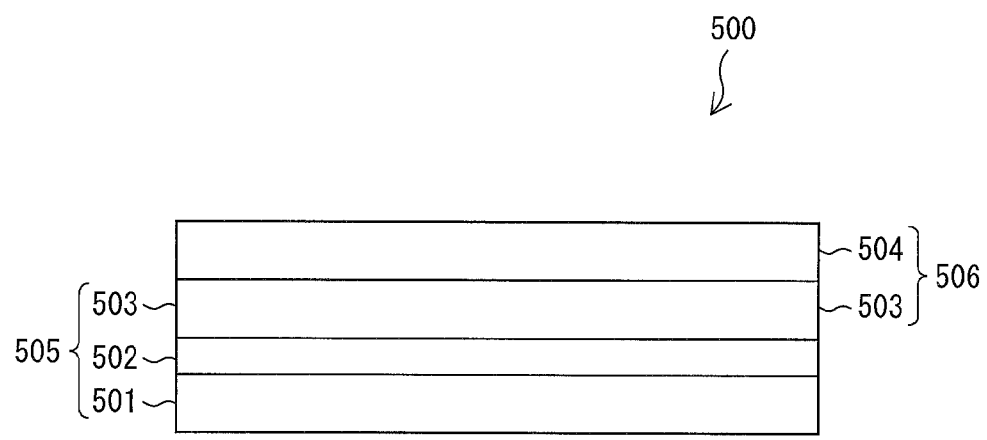
FIG. 11 is a cross-sectional view schematically illustrating a configuration of a conventional liquid crystal display device.
Figure 12:
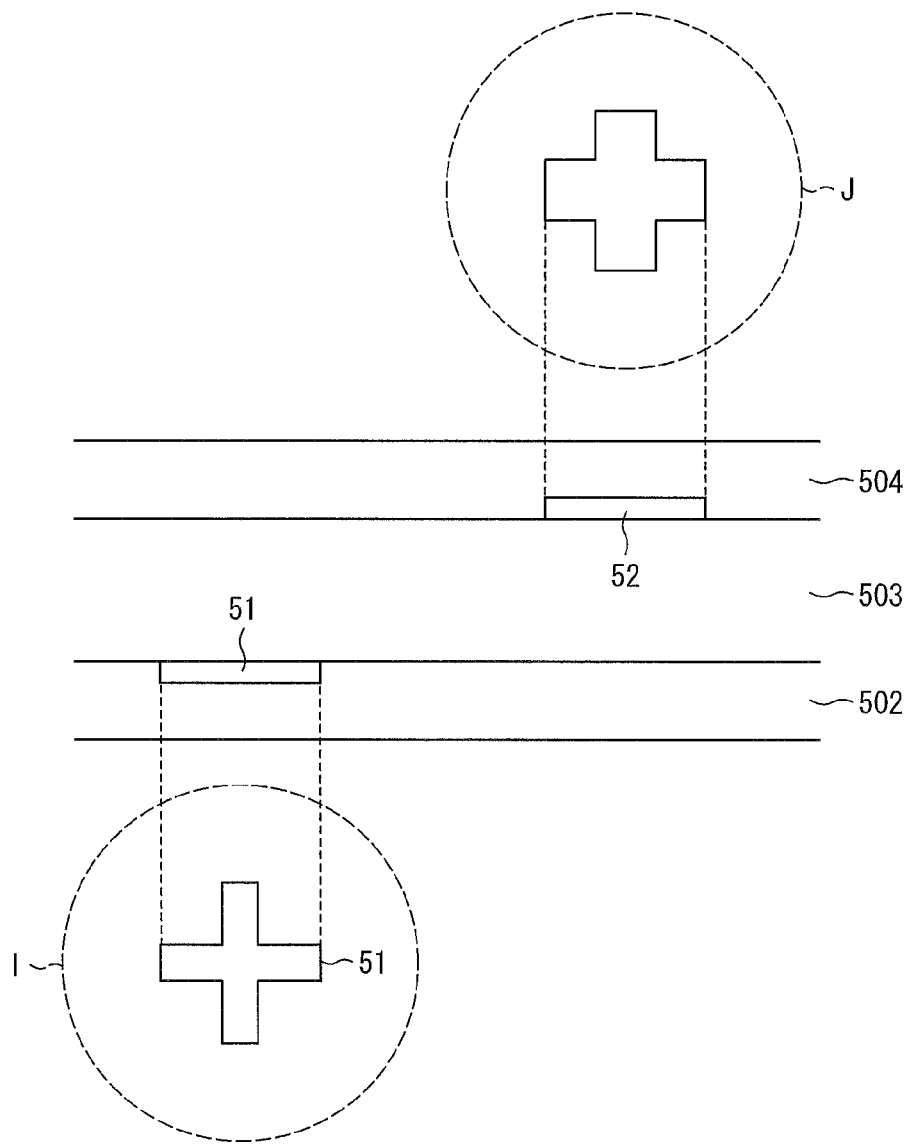
FIG. 12 is a view for describing alignment between the back surface-side and the front surface-side of the glass substrate of the liquid crystal display device.

The following description discusses the steps of forming the alignment mark 21, the alignment mark 26 and the opaque film 23. FIG. 10 is a view for describing the steps of forming the alignment mark 21, the alignment mark 26 and the opaque film 23.

First, as illustrated in (a) of FIG. 10, a resist pattern 27 is formed on the glass substrate 202. The resist pattern 27 is a pattern for forming the alignment mark 26. A design pattern of the resist pattern 27 is aligned with the alignment mark 21 which serves as a reference.

Next, as illustrated in (b) of FIG. 10, the glass substrate 202 is removed according to the resist pattern 27. That is, the alignment mark 26, which is constituted by a protrusion that is part of the glass substrate 202, is formed on the glass substrate 202.

Next, as illustrated in (c) of FIG. 10, a metal film 23a is stacked on the glass substrate 202 and the alignment mark 26. After the metal film 23a is stacked, a resist pattern 28 is formed on the metal film 23a. Since the metal film 23a is the same as that of the Embodiment 3, its description is omitted here.

Then, the resist pattern 28 is formed on the metal film 23a. The resist pattern 28 is a pattern for forming the opaque film 23 which makes the alignment mark 26 opaque. A design pattern of the resist pattern 28 is aligned with for example the alignment mark 26 which serves as a reference. It is needless to say that the design pattern of the resist pattern 28 may be aligned with the alignment mark 21 which serves as a reference.

Next, as illustrated in (d) of FIG. 10, the metal film 23a is removed according to the resist pattern 28. That is, the opaque film 23 is formed on the glass substrate 202. After the metal film 23a is removed, the resist pattern 28 is removed.

Lastly, as illustrated in (e) of FIG. 10, the color filter substrate 203 is formed on the glass substrate 202 and the opaque film 23.

As has been described, according to the liquid crystal display device 200 of Embodiment 4 of the present invention, since the alignment mark 26 is constituted by a protrusion that is part of the glass substrate 202, it is possible to detect the alignment mark 21 through the glass substrate 202, and thus possible to align the design pattern on the glass substrate 202 with the alignment mark 21 which serves as a reference.

This makes it possible to reduce the number of steps and material costs for the liquid crystal display device 200.

Note that, although the alignment mark 26 is made opaque by coating the alignment mark 26 with the metal film 23a in the present embodiment, this does not imply any limitation on the present invention.

For example, the alignment mark 26 may be made opaque by blackening (subjecting to blackening treatment) the alignment mark 26 constituted by the protrusion of the glass substrate 202 by irradiating the alignment mark 26 with laser.

The present invention is not limited to the descriptions of the respective embodiments, but may be altered within the scope of the claims. An embodiment derived from a proper combination of technical means disclosed in different embodiments is encompassed in the technical scope of the invention.

As has been described, a liquid crystal display device of the present invention includes: a touch panel; and a liquid crystal display panel, out of the touch panel and the liquid crystal display panel, one panel serving as a reference for alignment between the touch panel and the liquid crystal display panel and the other panel being aligned with the one panel, the other panel being provided with a second alignment mark that is aligned with a first alignment mark of the one panel, and the second alignment mark being constituted by a transparent member.

The liquid crystal display device is preferably configured such that the transparent member is a protruding part disposed on a transparent substrate that constitutes the other panel. In particular, the liquid crystal display device is preferably configured such that the transparent member is formed by removing the transparent substrate around an area where the protruding part is to be formed, the area being an area on a main surface, which is on a side opposite the one panel side, of the transparent substrate.

According to the configuration, the protrusion can be formed concurrently with the transparent substrate when the transparent substrate is formed into a thin film. This makes it unnecessary to separately carry out a step of forming the transparent substrate into a thin film to form the second alignment mark, and thus makes it possible to further reduce the number of steps and material costs for the liquid crystal display device.

The liquid crystal display device is preferably configured such that the transparent member is formed by removing part of a transparent film stacked on a main surface, which is on a side opposite the one panel side, of a transparent substrate that constitutes the other panel, the part being a part around an area of the main surface in which area the second alignment mark is to be positioned.

According to the configuration, the transparent member may be made from for example a touch electrode transparent conductive film that constitutes the touch panel. This makes it unnecessary to separately stack the transparent member for forming the second alignment mark, and thus makes it possible to further reduce the number of steps and material costs for the liquid crystal display device.

The liquid crystal display device is preferably configured such that the other panel further includes an opaque member provided so as to cover the second alignment mark.

According to the configuration, the second alignment mark constituted by the transparent member can be made opaque.

This makes it possible to cause the second alignment mark to serve as a reference, and to align a design pattern above the second alignment mark with the second alignment mark.

Accordingly, it is possible to improve accuracy in alignment of a design pattern above the second alignment mark.

The liquid crystal display device is preferably configured such that the second alignment mark is made opaque by a blackening treatment by laser irradiation.

The configuration makes it unnecessary to provide an opaque member that covers the second alignment mark, and thus makes it possible to further reduce the number of steps and material costs for the liquid crystal display device.

A method of producing a liquid crystal display device of the present invention is a method of producing the liquid crystal display device configured such that: out of a touch panel and a liquid crystal display panel, one panel serves as a reference for alignment between the touch panel and the liquid crystal display panel and the other panel is aligned with the one panel; and the other panel is provided with a second alignment mark that is aligned with a first alignment mark of the one panel, said method including the steps of: providing a transparent member on an entire surface of a transparent substrate that constitutes the other panel; and patterning the transparent member so that a transparent member remaining on the transparent substrate is aligned with the first alignment mark, thereby allowing the transparent member thus remaining on the transparent substrate to serve as the second alignment mark.

It is preferable that the method of the present invention further include the step of forming a resist pattern on the transparent member provided on the entire surface of the transparent substrate, the resist pattern being aligned with the first alignment mark through the transparent member, the resist pattern being used to pattern the transparent member.

According to the configuration, the first alignment mark is detected through the transparent member that is to be patterned, and the resist pattern is aligned with the first alignment mark thus detected.

This makes it possible to pattern the transparent member with reference to the first alignment mark thus detected.

A method of producing a liquid crystal display device of the present invention is a method of producing the liquid crystal display device configured such that: out of a touch panel and a liquid crystal display panel, one panel serves as a reference for alignment between the touch panel and the liquid crystal display panel and the other panel is aligned with the one panel; and the other panel is provided with a second alignment mark that is aligned with a first alignment mark of the one panel, said method including the step of: patterning a transparent substrate that constitutes the other panel so that a protruding part to be formed is aligned with the first alignment mark, thereby allowing the protruding part thus formed on the transparent substrate to serve as the second alignment mark.

It is preferable that the method of the present invention further include the step of forming a resist pattern on the transparent substrate, the resist pattern being aligned with the first alignment mark through the transparent substrate, the resist pattern being used to pattern the transparent substrate.

According to the configuration, the first alignment mark is detected through the transparent substrate that is to be patterned, and the resist pattern is aligned with the first alignment mark thus detected.

This makes it possible to pattern the transparent substrate with reference to the first alignment mark thus detected.

It is preferable that the method of the present invention further include the step of providing an opaque member so that the opaque member covers the second alignment mark.

According to the configuration, the second alignment mark constituted by the transparent member or the transparent substrate can be made opaque.

This makes it possible to cause the second alignment mark to serve as a reference, and to align a design pattern above the second alignment mark with the second alignment mark.

Accordingly, it is possible to improve accuracy in alignment of a design pattern above the second alignment mark.

It is preferable that the method of the present invention further include the step of making the second alignment mark opaque by blackening the second alignment mark by irradiating the second alignment mark with laser.

The configuration makes it unnecessary to provide an opaque member that covers the second alignment mark constituted by the transparent member or the transparent substrate. This makes it possible to further reduce the number of steps and material costs for the liquid crystal display device.

INDUSTRIAL APPLICABILITY

The present invention is applicable to a liquid crystal display device having a touch panel function. Specifically, the present invention is usable in a liquid crystal display device such as for example an active matrix liquid crystal display device. Further, the present invention is usable in an electrophoresis display, a twisting ball display, a reflective display using a fine prism film, and a display using an optical modulator such as a digital mirror device. Moreover, the present invention is usable in: a display using, as a light emitting element, an element whose luminance is variable such as an organic EL light emitting element, an inorganic EL light emitting element or an LED (light emitting diode); a field emission display (FED); and a plasma display.

REFERENCE SIGNS LIST 11, 21 Alignment mark (first alignment mark)
12, 16, 22, 26 Alignment mark (second alignment mark, protruding part)
12a Transparent conductive film (transparent member)
13, 23 Opaque film (opaque member)
14, 15, 17, 18, 24, 25, 27, 28 Resist pattern
22a Transparent resin film (transparent member)
100, 200 Liquid crystal display device
101, 204 TFT substrate
102, 203 Color filter substrate
103, 202 Glass substrate (transparent substrate)
104, 201 Protection film
105, 206 Liquid crystal display panel
106, 205 Touch panel

The invention claimed is:

1. A liquid crystal display device comprising:
a touch panel;
a transparent substrate; and
a liquid crystal display panel; wherein
one of the touch panel and the liquid crystal display panel is positioned on a second main surface of the transparent substrate;
another one of the touch panel and the liquid crystal display panel is positioned on a first main surface of the transparent substrate;
the another one of the touch panel and the liquid crystal display panel includes a counter substrate which faces the transparent substrate;
the second main surface of the transparent substrate includes a second alignment mark that is arranged in alignment with a first alignment mark of the counter substrate;
the second alignment mark is provided by a transparent member and the first alignment mark is provided by an opaque metal film; and
the second main surface of the transparent substrate further includes an opaque member provided in contact with the second alignment mark to cover the second alignment mark.

2. The liquid crystal display device according to claim 1, wherein the transparent member is a protruding portion disposed on the transparent substrate.

3. The liquid crystal display device according to claim 2, wherein the transparent member is defined by removing the transparent substrate around an area where the protruding portion is arranged, the area being an area on the second main surface of the transparent substrate.

4. The liquid crystal display device according to claim 1, wherein the transparent member is defined by removing a portion of a transparent film stacked on the second main surface of the transparent substrate, the portion of the transparent film being a portion around an area of the second main surface in which the second alignment mark is to be positioned.

5. The liquid crystal display device according to claim 1, wherein the second alignment mark is made opaque by a blackening treatment by laser irradiation.

6. A method of producing a liquid crystal display device, the liquid crystal display device including:
a touch panel;
a transparent substrate; and
a liquid crystal display panel, wherein
one of the touch panel and the liquid crystal display panel is positioned on a second main surface of the transparent substrate;
another one of the touch panel and the liquid crystal display panel is positioned on a first main surface of the transparent substrate;
the another one of the touch panel and the liquid crystal display panel includes a counter substrate which faces the transparent substrate;
the second main surface of the transparent substrate includes a second alignment mark that is provided in alignment with a first alignment mark of the counter substrate;
the second alignment mark is provided by a transparent member and the first alignment mark is provided by an opaque metal film; and
the second main surface of the transparent substrate further includes an opaque member provided in contact with the second alignment mark to cover the second alignment mark,
said method comprising the steps of:
providing a transparent member over an entirety of the second main surface of the transparent substrate; and
patterning the transparent member so that a transparent member remaining on the transparent substrate is aligned with the first alignment mark so as to allow the transparent member remaining on the transparent substrate to define the second alignment mark.

7. The method according to claim 6, further comprising the step of forming a resist pattern on the transparent member provided over an entirety of the second main surface of the transparent substrate, the resist pattern being aligned with the first alignment mark through the transparent member,
the resist pattern being used to pattern the transparent member.

8. The method according to claim 6, further comprising the step of providing an opaque member so that the opaque member covers the second alignment mark.

9. The method according to claim 6, further comprising the step of making the second alignment mark opaque by blackening the second alignment mark by irradiating the second alignment mark with laser.

10. A method of producing a liquid crystal display device, the liquid crystal display device including:
a touch panel;
a transparent substrate; and
a liquid crystal display panel, wherein
one of the touch panel and the liquid crystal display panel is positioned on a second main surface of the transparent substrate
another one of the touch panel and the liquid crystal display panel is positioned on a first main surface of the transparent substrate;
the another one of the touch panel and the liquid crystal display panel includes a counter substrate which faces the transparent substrate;
the second main surface of the transparent substrate includes a second alignment mark that is provided in alignment with a first alignment mark of the counter substrate;

the second alignment mark is provided by a transparent member and the first alignment mark is provided by an opaque metal film; and the second main surface of the transparent substrate further includes an opaque member provided in contact with the second alignment mark to cover the second alignment mark, said method comprising the step of:

patterning the second main surface of the transparent substrate so that a protruding portion to be formed is aligned with the first alignment mark so as to allow the protruding portion to define the second alignment mark.

11. The method according to claim 10, further comprising the step of forming a resist pattern on the second main surface of the transparent substrate, the resist pattern being aligned with the first alignment mark through the transparent substrate, the resist pattern being used to pattern the transparent substrate.

* * * * *